United States Patent
Huang et al.

(10) Patent No.: US 7,466,177 B2
(45) Date of Patent: Dec. 16, 2008

(54) PULSE-WIDTH CONTROL LOOP FOR CLOCK WITH PULSE-WIDTH RATIO WITHIN WIDE RANGE

(75) Inventors: Hong-Yi Huang, Hsinchu (TW);
Wei-Ming Chiu, Hsinchu (TW);
Yuan-Hua Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 137 days.

(21) Appl. No.: 11/491,159

(22) Filed: Jul. 24, 2006

(65) Prior Publication Data

US 2007/0146025 A1 Jun. 28, 2007

(30) Foreign Application Priority Data

Dec. 23, 2005 (TW) .............................. 94146243 A

(51) Int. Cl.
*H03K 3/17* (2006.01)
(52) U.S. Cl. .................... 327/175; 327/172; 327/291
(58) Field of Classification Search ......... 327/172–175, 327/291, 164–166
See application file for complete search history.

(56) References Cited

U.S. PATENT DOCUMENTS

| | | | |
|---|---|---|---|
| 5,740,213 A * | 4/1998 | Dreyer ........................ 375/374 |
| 5,912,574 A | 6/1999 | Bhagwan | |
| 6,501,313 B2 | 12/2002 | Boerstler et al. | |
| 6,542,040 B1 * | 4/2003 | Lesea .......................... 331/11 |
| 6,812,782 B2 | 11/2004 | Grant | |
| 6,833,743 B2 * | 12/2004 | Gu et al. ...................... 327/175 |
| 6,894,548 B2 | 5/2005 | Hochschild et al. | |
| 6,903,585 B2 * | 6/2005 | Keaveney .................... 327/148 |
| 7,009,436 B2 * | 3/2006 | Huang et al. ................. 327/172 |

FOREIGN PATENT DOCUMENTS

| | | |
|---|---|---|
| TW | 360789 | 6/1999 |
| TW | 480378 | 3/2002 |
| TW | 200511726 | 3/2005 |

* cited by examiner

*Primary Examiner*—Lincoln Donovan
*Assistant Examiner*—Hai L. Nguyen
(74) *Attorney, Agent, or Firm*—Rabin & Berdo, P.C.

(57) ABSTRACT

A pulse-width control loop (PWCL) for clock with any pulse-width ratio within a wide range is provided. A differential programmable charge pump is employed to stabilize the current source by complementary connection. The differential programmable charge pump has a pair of differential charge pumps and a current source module to adjust the ratio of charge to discharge, so as to accelerate the range of the adjustable pulse-width ratio of the output clock and increase the output resolution. Further, a ratioless input control stage is employed to simplify the circuit design and avoid static power consumption. Moreover, the control stage adjusts rising pulse width and dropping pulse width at one period, thereby accelerating the lock speed and the range of the adjustable pulse-width ratio (i.e., duty cycle) of the input clock.

28 Claims, 25 Drawing Sheets

2356

2356

PULSE-WIDTH CONTROL LOOP FOR CLOCK WITH PULSE-WIDTH RATIO WITHIN WIDE RANGE

CROSS-REFERENCE TO RELATED APPLICATIONS

This non-provisional application claims priority under 35 U.S.C. § 119(a) on Patent Application No(s). 094146243 filed in Taiwan, R.O.C. on Dec. 23, 2005, the entire contents of which are hereby incorporated by reference.

BACKGROUND OF THE INVENTION

1. Field of Invention

The present invention relates to a pulse-width control loop (PWCL), and more particularly, to a PWCL for a clock with any pulse-width ratio within a wide range.

2. Related Art

The clock signal plays an important role in the design of an integrated circuit (IC). In general, the amplitude of the clock signal equals the power supply for the system, the frequency thereof must fit the specification of the whole system, and the phase and pulse-width ratio thereof must be adjusted according to the requirements of the circuit. In other words, with respect to the operation of the whole system, the precision of the characteristics of the clock signal is very important, because it may affect the performance of the whole system. Therefore, when the clock signal is distorted, the application system can not function properly. As a result, in circuit design, the error of the characteristics of the clock signal must be controlled within a small, acceptable range, to avoid affecting the performance of the whole system.

At present, most high-speed digital system designs focus on how to restrain the clock signal from the clock skew and the clock jitter. In many electronic devices (such as microprocessors, and memory interfaces), phase locked loops (PLL) and delay locked loops (DLL) are widely adopted to correct the frequency and phase of the signals. Moreover, with regard to the duty cycle of the clock (i.e., the pulse-width ratio), PWCL has been developed to ensure the precision of the output pulse-width ratio.

Referring to FIG. 1, it is a basic architecture of a PWCL, which mainly includes an input control stage 110, a buffer module 120, a charge pump 130, a low pass filter (LPF) 140, and a transconductor 150, which are connected in series to form a loop, so as to adjust the pulse-width ratio of an output clock CKo to a desired ratio according to the received input clock CKi by a feedback mechanism.

As shown in FIG. 1, when the input control stage 110 receives the input clock CKi, the charge pump 130 converts the pulse-width of the input clock CKi into a current value, and the pulse-width ratio is determined by the ratio of charge to discharge. Then, the current is converted into a voltage signal by the LPF 140. The voltage signal is compared by the transconductor 150 to generate a feedback signal Vf and then the feedback signal Vf is fed back the input control stage 110. Big load is driven by the buffer module 120 formed by a cascade of multiple buffers based on feedback signals Vf with different potentials, for regulating the pulse width of the output clock CKo, thereby obtaining the output clock CKo of desired pulse-width ratio. When the pulse width is locked, the feedback signal Vf is a fixed value.

Referring to FIG. 2, a conventional PWCL controls a first charge pump 132 to charge/discharge a capacitor C1 using a ring oscillator 124, so as to generate a reference potential Vref of 50% duty cycle, and controls a second charge pump 134 to charge/discharge a capacitor C2, so as to generate a comparative potential Vc. The comparative potential Vc is compared with the reference potential Vref by the transconductor 150 to feed a feedback signal Vf back the input control stage 110, thereby adjusting the duty cycle of the buffer chain 122. As such, an input clock CKi with a duty cycle lower or larger than 50% can be adjusted by the buffer chain 122 to generate an output clock CKo with a duty cycle of 50%. At this time, the comparative potential Vc is equal to the reference potential Vref, and the loop is locked. The ring oscillator 124 must generate a reference potential of 50% duty cycle. However, it is difficult to implement in practice, and the loop may be unstable if the oscillated signal frequency selected is inappropriate.

Furthermore, another conventional PWCL is a low-voltage PWCL, as shown in FIG. 3. A push-pull charge pump 136 replaces the whole conventional feedback path. In this case, the comparator, i.e., transconductor in the conventional architecture, is not required in the whole circuit, so the circuit is more suitable to operate under a low voltage. However, as the input clock CKi is also used as a basis for generating a reference voltage, the input clock CKi must be a signal with 50% duty cycle. Therefore, the application range of the PWCL is limited.

Furthermore, another conventional PWCL is a complementary PWCL, as shown in FIG. 4, for solving the problem of a requirement of a reference voltage. In this case, a buffer module 120 generates complementary signal, to causing a 180° phase difference between the input clocks of the first charge pump 132 and the second charge pump 134. As the phase difference is generated partially, the variation of the phase difference is not too great. When the loop is not locked, the first comparative potential Vc+ and the second comparative potential Vc− have opposite actions. As compared with the conventional circuit architecture (referring to FIG. 1), the reference potential Vref of the complementary PWCL must be a fixed value, and only the comparative potential Vc thereof can vary. Therefore, in the complementary circuit architecture, the variation of the feedback signals Vf output by the comparator after each comparison is twice of a conventional one, such that it can be locked fast. However, under the circuit architecture, as the ratio of charge to discharge of the charge pump is fixed, only the output clock CKo of 50% duty cycle can be output, such as to limit its application range to some extent.

Referring to FIG. 5, it is another conventional PWCL, which is a fast-Locking PWCL. A voltage-difference-to-digital converter (VDDC) 160 is used to compare the reference potential Vref and the comparative potential Vc, for generating different digital signals to control a switched charge pump 138 to change its current amount at different voltage differences, thereby accelerating the circuit operation to achieve fast locking. Moreover, as the switched charge pump is adopted, when the ratio of charge to discharge of the switched charge pump varies, an output clock CKo with non-50% duty cycle is also generated. However, it is difficult to keep the ratio of charge to discharge during switching the on/off of the charge pump precise, so the range of the output duty cycle only falls in 35%~70%, and the scale of each adjustment is 5%. Besides, as the design of the VDDC 160 is similar to a flash analog to digital converter (Flash ADC), more power is consumed to achieve fast phase-locking.

Another conventional PWCL is a phase-locking PWCL, as shown in FIG. 6. A synchronous mirror delay (SMD) module 170 is used to control the delay time of the input clock CKi, so as to achieve the phase-locking of the input clock CKi and the output clock CKo. Further, a digital controlled charge pump (DCCP) 139 is used to control different current ratios, so as to output the output clock CKo with non-50% duty cycle. Likewise, the ratio of charge to discharge can not be also kept precise when switching the on/off of the charge pump, so in this circuit architecture, the range of the duty cycle of the output clock just falls in 20% to 50%, wherein the scale of each adjustment is 10%.

In view of the above, though each of the conventional circuit architectures has its own emphasized functions, the acceptable range of the pulse-width ratio (i.e., the duty cycle) of the input/output clock is limited, thus causing problems such as, a complicated architecture, increased power consumption, or large dimensions when fabricating a chip. Besides, some circuit architectures can only output the output clocks with 50% pulse-wide ratio, and a few of circuit architectures which can control the pulse-width ratios of the output clocks have the poor acceptable ranges and resolutions. Therefore, how to generate the output clocks with any pulse-width ratio within a wide range (unlimited, for example, duty cycle 1%~99%) and/or input the input clocks with any pulse-width ratio within a wide range (unlimited, for example, duty cycle 1%~99%) becomes a very important in PWCL, thereby providing wider applications.

SUMMARY OF THE INVENTION

In view of the above, the object of the invention is to provide a PWCL for clock with any pulse-width ratio within a wide range, for solving the problems of a requirement of a reference voltage, a low resolution, and a limitation to the application range disclosed in the prior arts.

The PWCL for clock with any pulse-width ratio within a wide range disclosed in the invention comprises an input control stage, a buffer module, a programmable charge pump, a low pass filter (LPF), and a transconductor, which are connected in series to form a loop. The input control stage is used to change the pulse-width ratio of an input clock according to a feedback signal, thereby generating a modulating signal. The buffer module is used to buffer and reverse the modulating signal, thereby generating an output clock and a complementary signal, wherein the phase of the output clock is opposite to that of the complementary signal. The programmable charge pump has a pair of differential charge pumps and a current source module, wherein the current source module is used to adjust the ratio of charge to discharge of the differential charge pumps, such that each of the differential charge pumps adjusts the potential of the first comparative signal or the potential of the second comparative signal according to the ratio of charge to discharge. The LPF is used to filter the first and the second comparative signals. The transconductor is used to compare the filtered first and second comparative signals, thereby adjusting the feedback signal. When the loop is locked, the potential between the two differential charge pumps is kept constant to stabilize the charge/discharge current. As a result, the output clocks with any pulse-width ratio can be obtained by changing the ratio of charge to discharge of the differential charge pumps.

It is an advantage of the input control stage that the PWCL for clock with any pulse-width ratio within a wide range according to the invention can adjust the rising and the dropping pulse widths of the signal simultaneously, thereby accelerating the modulating speed of the pulse-width ratio and enlarging the acceptable range of the duty cycle of the input clock, for preventing the applicable pulse-width ratio of the input clock from tending to fall in a certain range. Besides, as above circuit architecture can adjust the rising and dropping pulse widths of the clock signal, when designing the circuit, the selection of the dimensions of the used transistors will not be affected by its electron drift rate, and thereby, it is unnecessary to keep the dimensions of the two transistors in a specific proportion, and thus it is easier to implement the design. Moreover, when above circuit architecture operates, the DC conductive path is not generated, and therefore static power consumption is avoided.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

Figure 1:
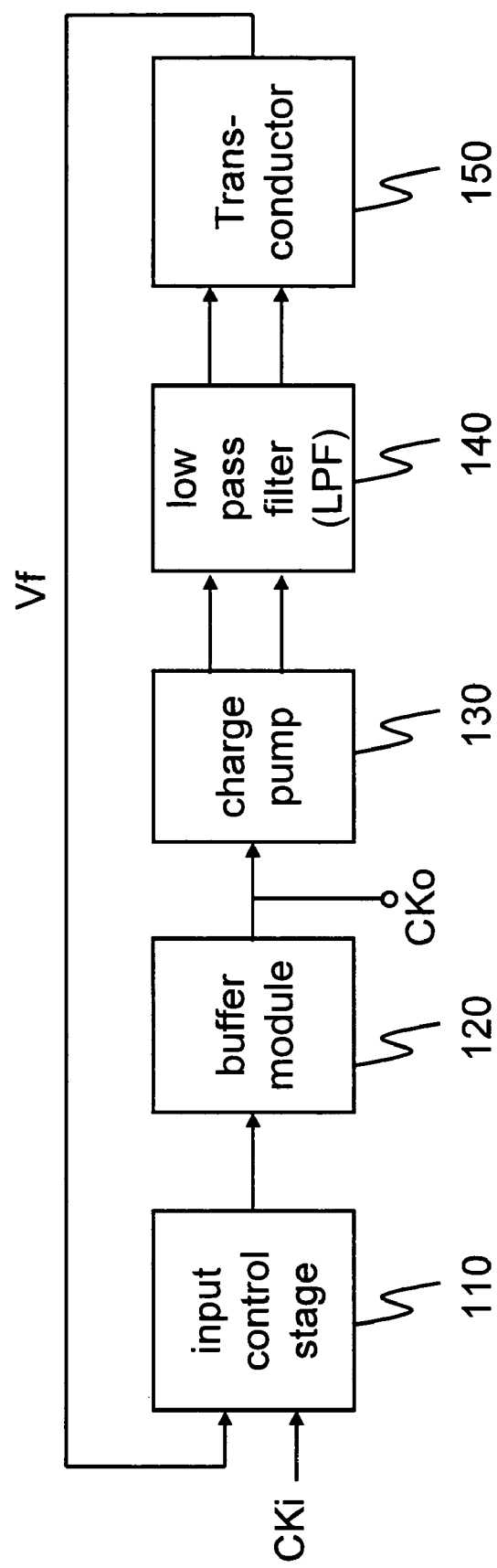
FIG. 1 is a basic architectural view of a conventional PWCL.
Figure 2:
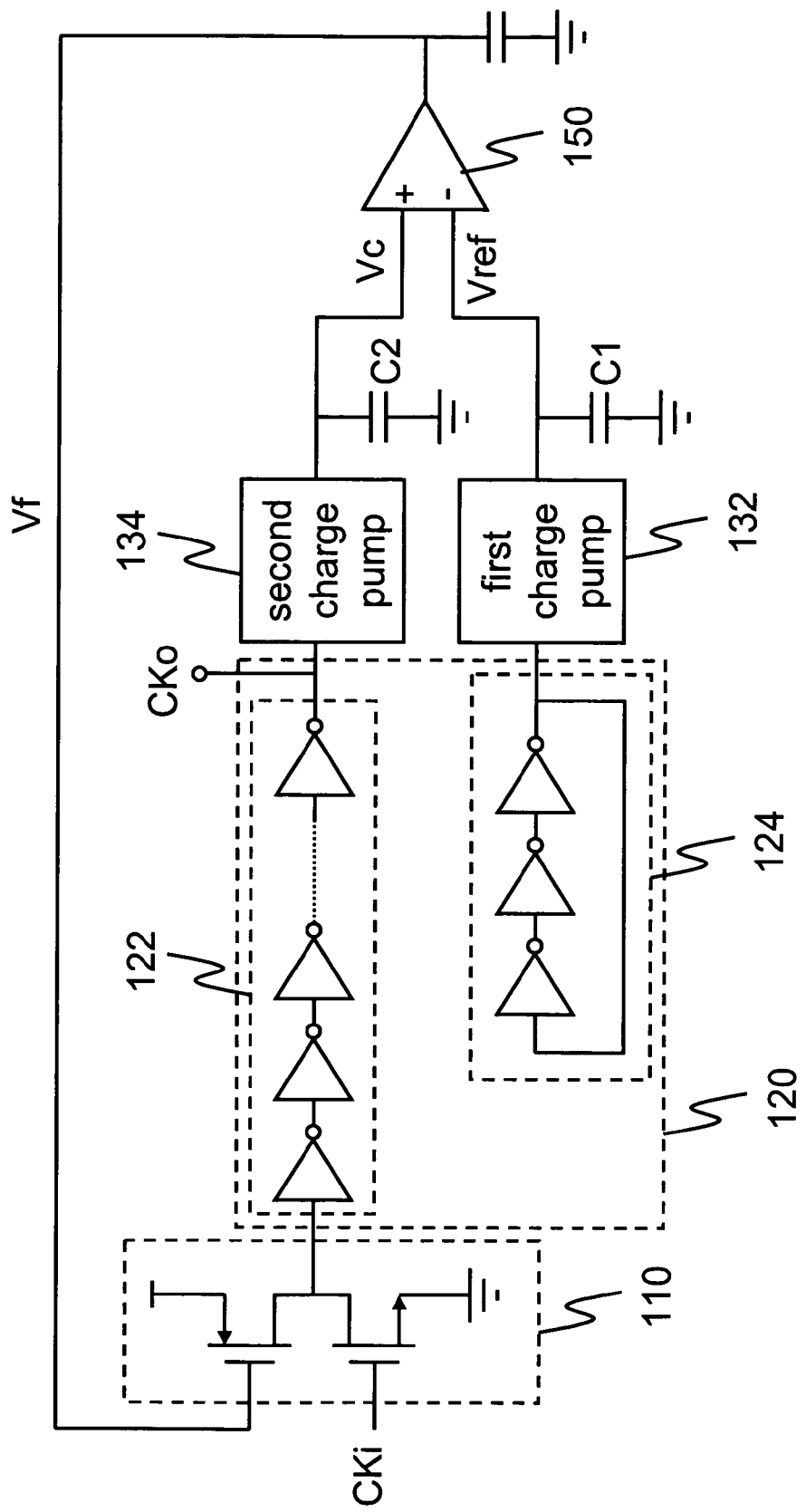
FIG. 2 is a general structural view of a conventional PWCL.
Figure 3:
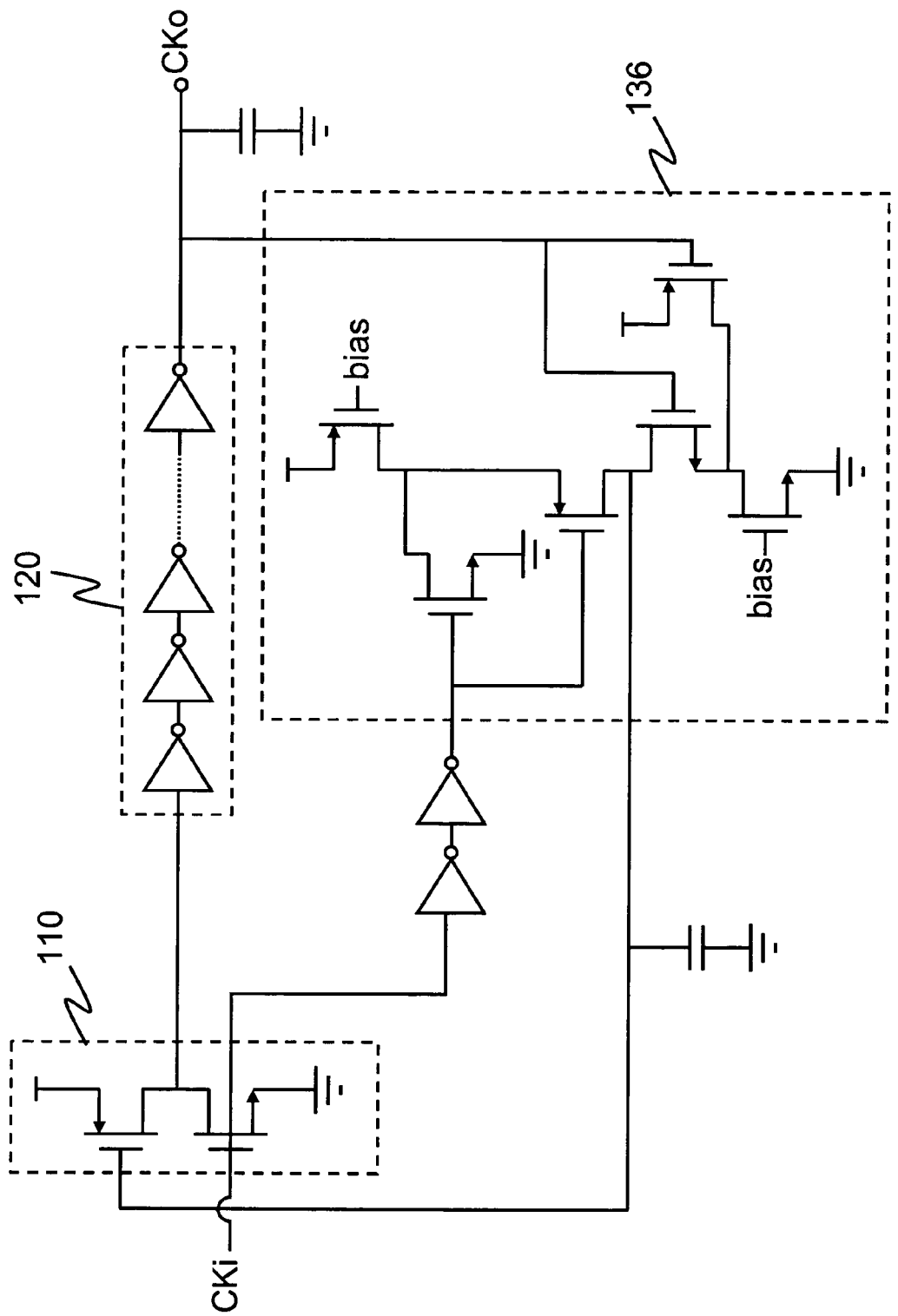
FIG. 3 is a general structural view of a conventional low-voltage PWCL.
Figure 4:
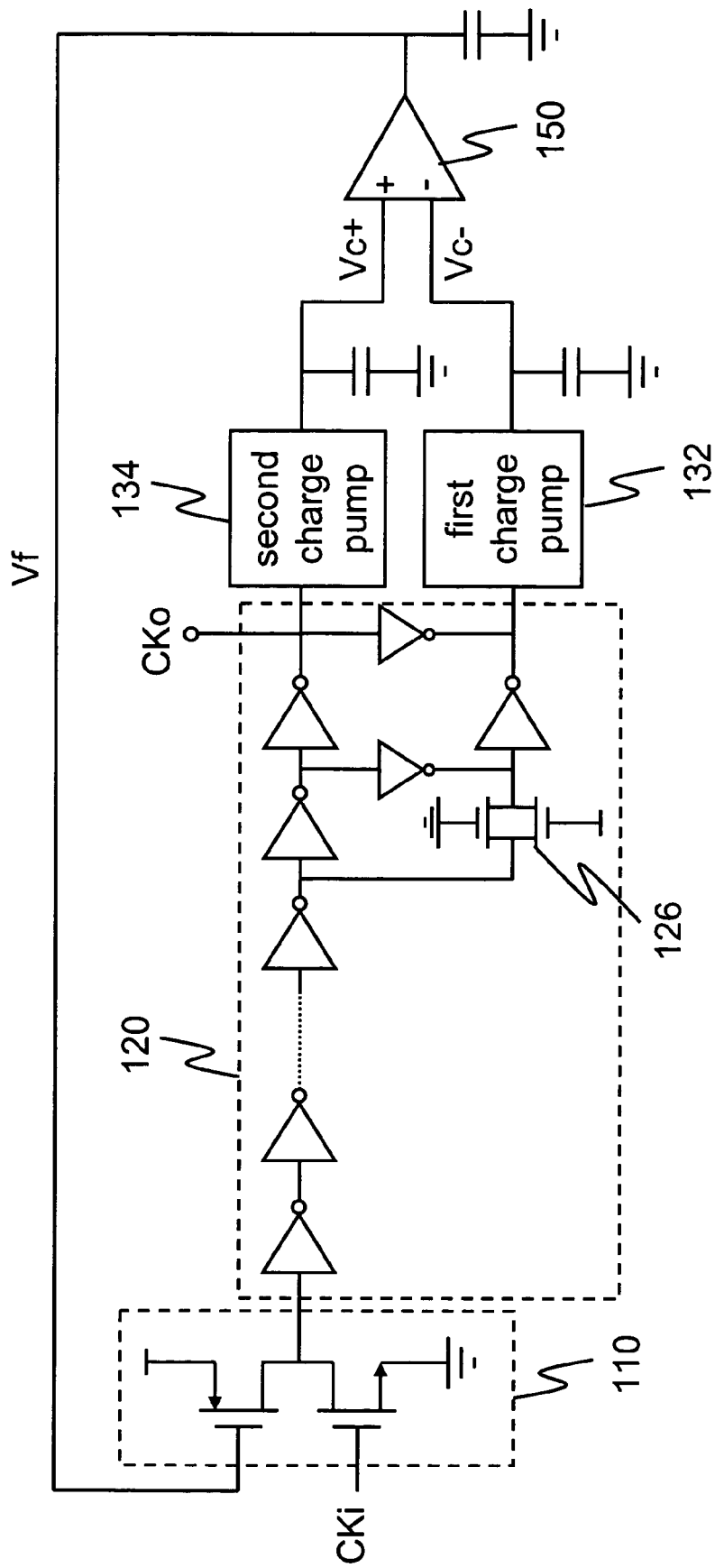
FIG. 4 is a general structural view of a conventional complementary PWCL.
Figure 5:
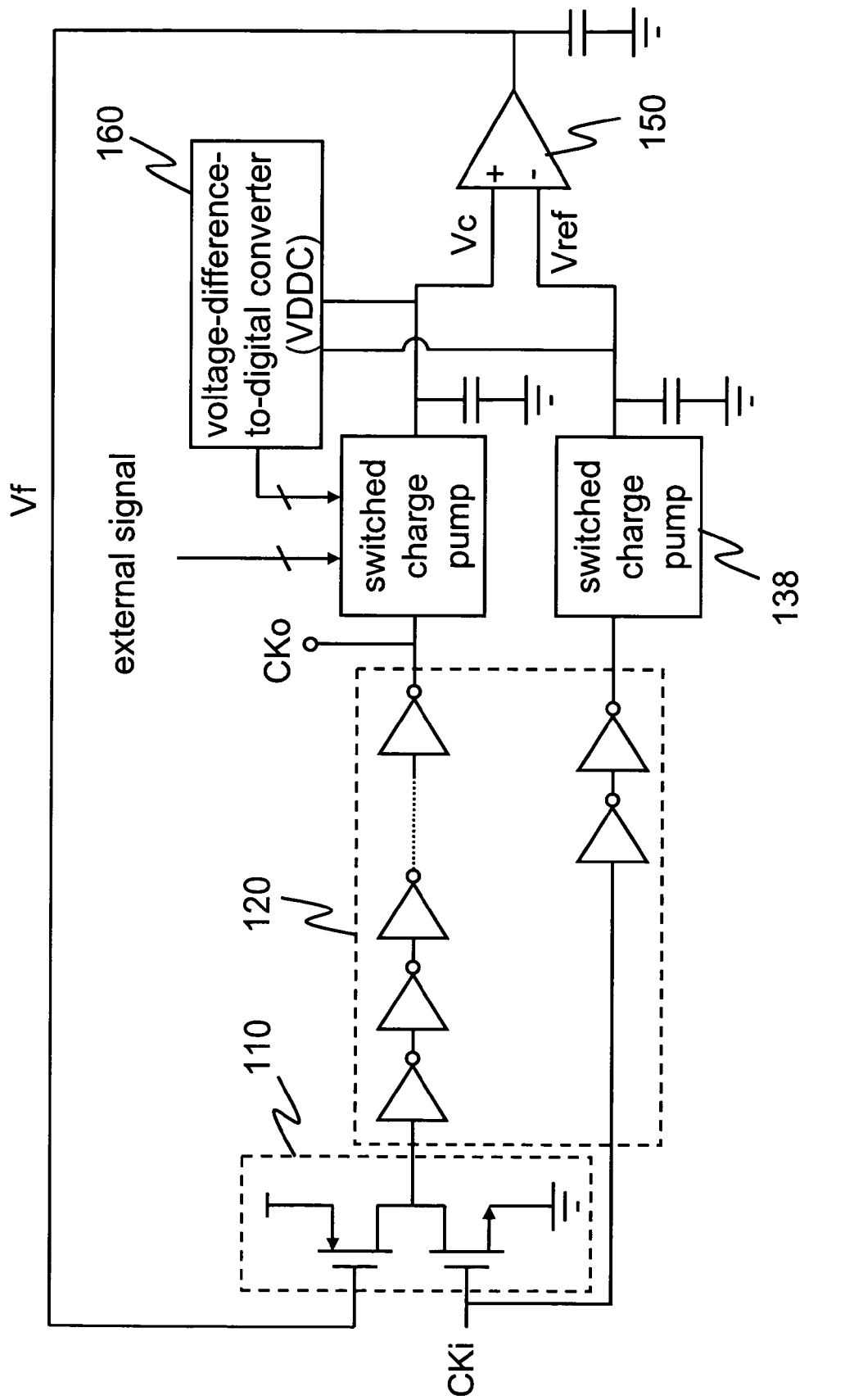
FIG. 5 is a general structural view of a conventional fast-locking PWCL.
Figure 6:
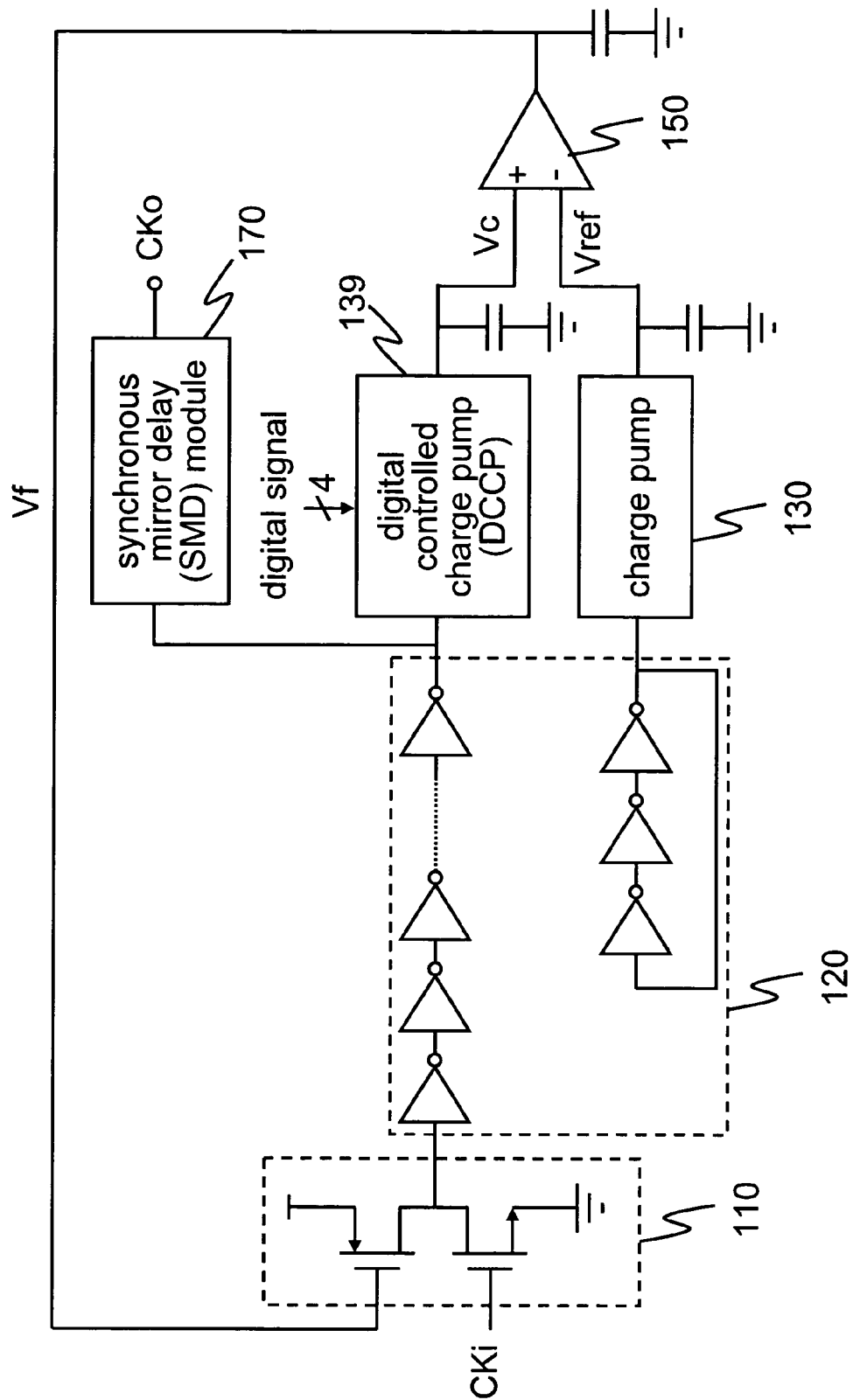
FIG. 6 is a general structural view of a conventional phase-locking PWCL.

The content of the invention is illustrated by embodiments accompanied with the drawings in detail below. The symbols mentioned in the illustration refer to the symbols in the drawings.

The invention adopts a complementary architecture design. A programmable charge pump is provided in a differential manner, such that the current source is stabilized via means of complementary connection, thereby expanding the adjustable range of pulse-width ratios of the output clock and increasing the resolution. Besides, a ratioless input control stage, which has a simple circuit design and does not have static power consumption, is provided to adjust the rising and dropping pulse at the same time, thereby accelerating the lock speed and expanding the acceptable range of pulse-width ratios (i.e., the duty cycles) of the input clock. A 2-stage LPF can be further employed to increase the stability of the system, where under the signal complementary characteristic, the cross capacitor connects the complementary signals to significantly reduce the size of the system. And the error caused by parasitic effect can be reduced through the layout skill. Moreover, a control signal detector is further employed, where different on/off control signals are generated through a counter and a decoder according to different requirements for outputting the output signal with desired pulse-width ratio, to adjust the ratio of charge to discharge of current, thereby accelerating the lock in time.

Figure 7:
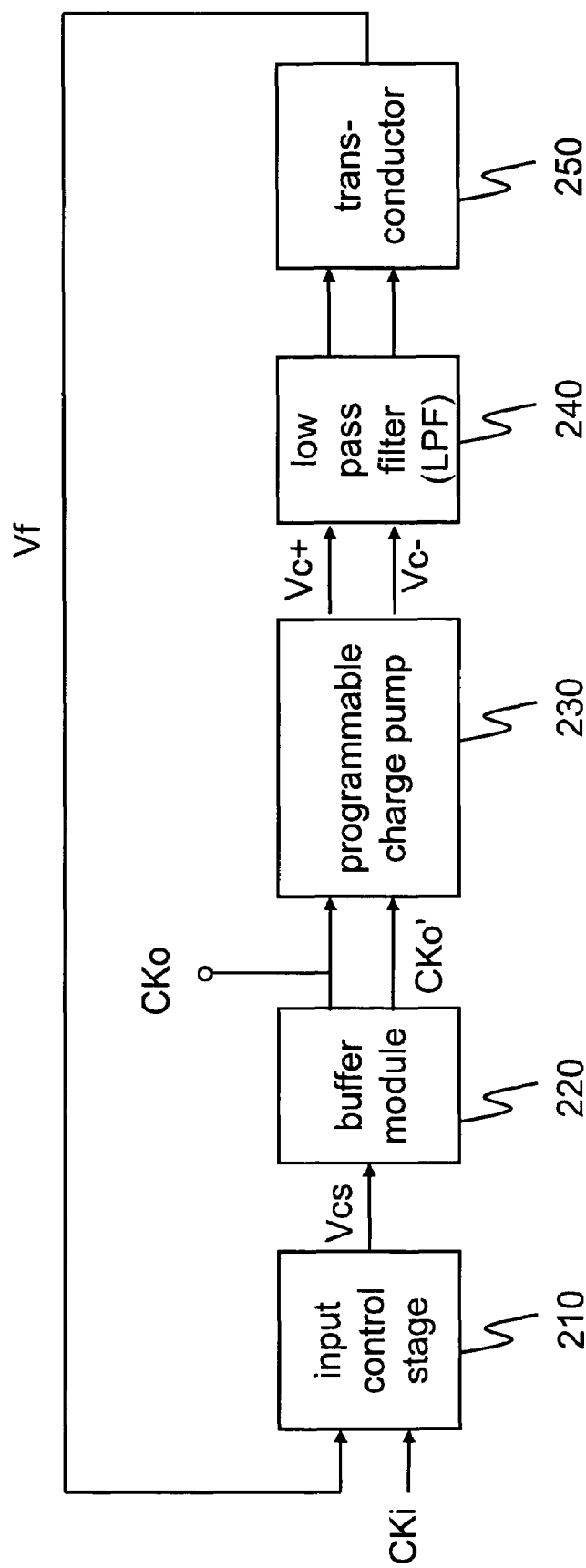
FIG. 7 is the basic architectural view of the PWCL according to the invention.

Referring to FIG. 7, it is the basic architecture of the PWCL for clock with any pulse-width ratio within a wide range according to the invention, which comprises an input control stage 210, a buffer module 220, a programmable charge pump 230, a LPF 240, and a transconductor 250, which are connected in series to form a loop, where the pulse-width ratio of a received input clock CKi is adjusted to a desired one with the feedback mechanism.

Input Control Stage

Figure 9:
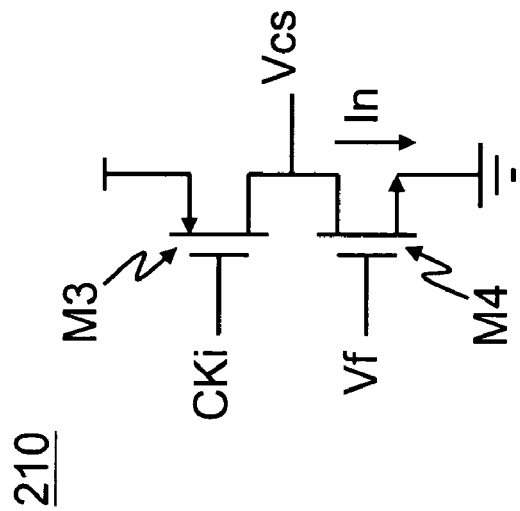
FIG. 9 is a general structural view of the input control stage depicted in FIG. 7 according to the second embodiment.
Figure 8:
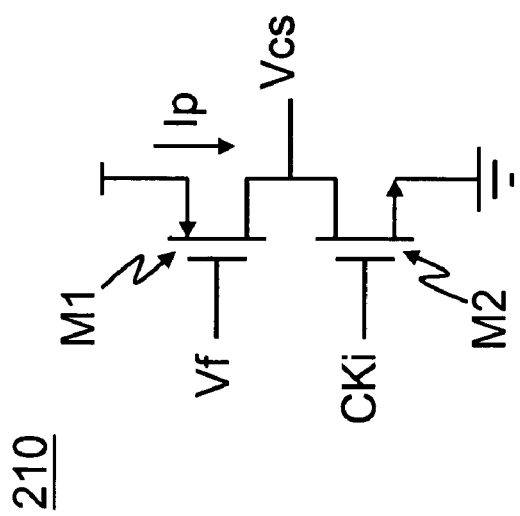
FIG. 8 is a general structural view of the input control stage in FIG. 7 according to the first embodiment.

The input control stage 210 can be is a circuit architecture with a PMOS as a control MOS (as shown in FIG. 8), or a circuit architecture with an NMOS as a control MOS (as shown in FIG. 9).

Referring to FIG. 8, in the circuit architecture of the input control stage 210, the first transistor M1 is a PMOS, and the second transistor M2 is an NMOS. The drain of the first transistor M1 is connected to the drain of the second transistor M2. The source of the first transistor M1 is connected to a voltage source. And the source of the second transistor M2 is grounded.

The input clock CKi is input into the gate of the second transistor M2, and the feedback signal Vf is input into the gate of the first transistor M1, for controlling the charge current Ip according to the feedback signal Vf, i.e., modulating the charge/discharge current of the first transistor M1 according to variation in the potential of the feedback signal Vf, thereby changing the pulse-width ratio of the input clock CKi, so as to generate a modulating signal Vcs to a buffer module of the next stage.

In the circuit architecture, the charge current Ip is changed according to the feedback signal Vf, such that the pulse width of the input clock CKi is adjusted to determine the duty cycle of the generated modulating signal Vcs. Therefore, it is suitable to be used when the pulse-width ratio of the input clock CKi is small (i.e., the adjustable rising pulse width is wider).

In another embodiment, referring to FIG. 9, in the circuit architecture of the input control stage 210, a third transistor M3 is an NMOS, and a fourth transistor M4 is a PMOS. The drain of the third transistor M3 is connected to the drain of the fourth transistor M4. The source of the third transistor M3 is connected to a voltage source. And the source of the fourth transistor M4 is grounded.

The input clock CKi is input into the gate of the third transistor M3, and the feedback signal Vf is input unto the gate of the fourth transistor M4, for controlling the discharge current In according to the feedback signal Vf, i.e., modulating the charge/discharge current of the fourth transistor M4 according to variation in the potential of the feedback signal Vf, thereby changing the pulse-width ratio of the input clock CKi, so as to generate a modulating signal Vcs to a buffer module of the next stage.

Herein, the discharge current is changed according to the feedback signal Vf, such that the pulse width of the input clock CKi is adjusted to determine the duty cycle of the generated modulating signal Vcs. Therefore, it is suitable to be used when the pulse-width ratio of the input clock CKi is large (i.e., the adjustable dropping pulse width is wider).

Figure 10:
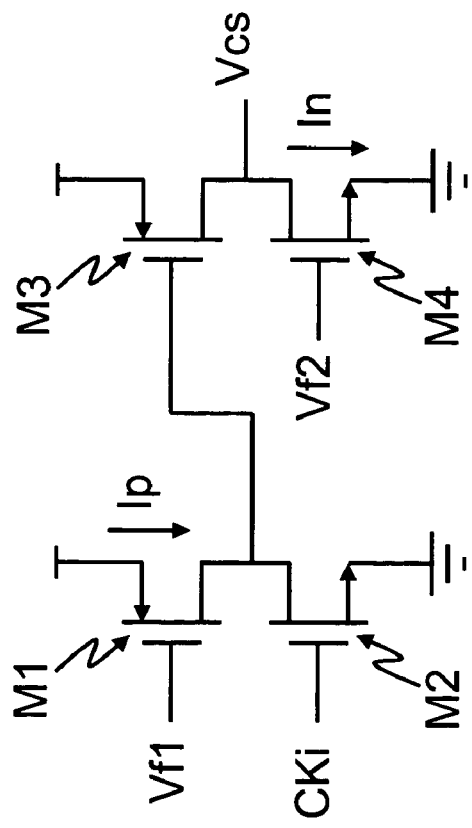
FIG. 10 is a general structural view of the input control stage depicted in FIG. 7 according to the third embodiment.

Besides, in yet another embodiment, the input control stage 210 can be a cascade architecture, as shown in FIG. 10. Referring to FIG. 10, the above two circuit architectures are cascaded, i.e., the junction of the drain of the first transistor M1 and the drain of the second transistor M2 is taken as the input of the third transistor M3. In other words, the drain of the first transistor M1, the drain of the second transistor M2, and the gate of the third transistor M3 are connected to each other.

The input clock CKi is input into the gate of the second transistor M2, and two feedback signals Vf1, Vf2 are respectively input into the gates of the first transistor M1 and the fourth transistor M4, for respectively controlling the charge current Ip and the discharge current In according to the feedback signals Vf1, Vf2, thereby changing the pulse-width ratio of the input clock CKi and accordingly outputting a modulating signal Vcs from the junction of the drains of the third transistor M3 and the fourth transistor M4 into a buffer module of the next stage. When the cascade architecture is used as the input control stage 210, in the last stage, the transconductor should be correspondingly designed to be capable of outputting the two feedback signals Vf1, Vf2. As the architecture and operational principle of the transconductor capable of outputting two feedback signals are known to those skilled in the art, they will not be described herein.

Figure 11:
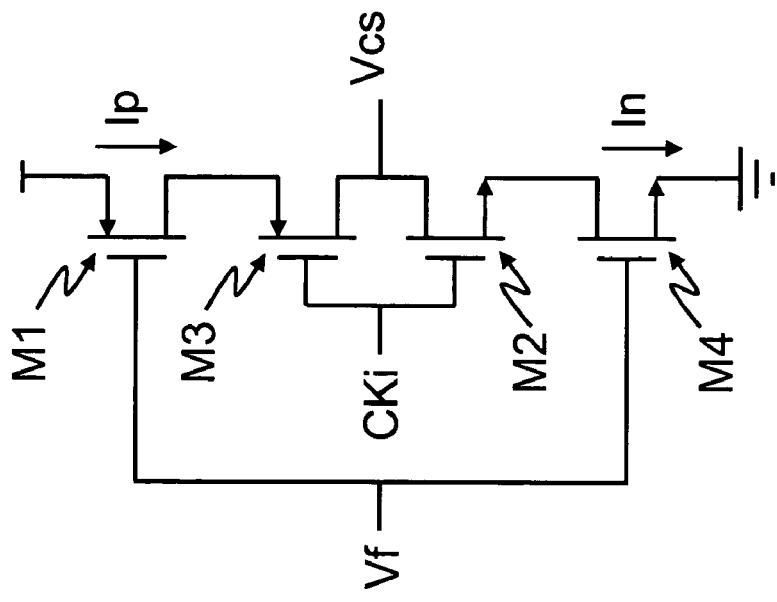
FIG. 11 is a general structural view of the input control stage depicted in FIG. 7 according to the fourth embodiment.

The input control stage 210 can be self-bias circuit architecture, as shown in FIG. 11. The drain of the first transistor M1 is connected to the source of the third transistor M3. The source of the second transistor M2 is connected to the drain of the fourth transistor M4. The input clock CKi is input into the gate of the second transistor M2 and the gate of the third transistor M3, and the feedback signal Vf is input into the gate of the first transistor M1 and the gate of the fourth transistor M4, for controlling the charge current Ip and the discharge current In, thereby changing the pulse-width ratio of the input clock CKi to output a modulating signal Vcs from the junction of the drains of the second transistor M2 and the third transistor M3 into a buffer module of the next stage.

As the PMOS (i.e., the first transistor M1) and the NMOS (i.e., the fourth transistor M4) are simultaneously used as control transistors, when the potential of the feedback signal Vf drops, the charge current Ip is increased and the discharge current In is reduced, thereby increasing the pulse-width ratio of the modulating signal Vcs. Otherwise, when the potential of the feedback signal Vf rises, the charge current Ip is reduced and the discharge current In is increased, thereby reducing the pulse-width ratio of the modulating signal Vcs.

As such, when the self-bias circuit architecture is adopted, the rising and the dropping pulse widths of the signal can be simultaneously adjusted, thereby accelerating the modulating speed of the pulse-width ratio and expanding the acceptable range of the duty cycle of the input clock, such that the applicable pulse-width ratio of the input clock is prevented from tending to fall in a certain range, i.e., it allows inputting the input clock with any pulse-width ratio within the wide range. Besides, as the rising and the dropping pulse widths of the clock signal can be adjusted in the circuit architecture, in the circuit design, the selection of the dimensions of the PMOS and NMOS will not be affected by the electron drift rate. Therefore, it is unnecessary to keep the dimensions of the PMOS and NMOS in a specific proportion, and thus it is easy to implement. Furthermore, in this circuit architecture, the DC conductive path is not generated, and therefore static power consumption is avoided.

Buffer Module

The number of the stages of the buffer module is determined by the loading of the output clock, and the odd or even of the stage is determined by the output position of the transconductor.

The buffer module 220 is complementary, which is formed by a series of buffers (not shown), for buffering and reversing the received modulating signal Vcs, thereby generating the output clock CKo and a complementary signal CKo' with an opposite phase to the phase of the output clock CKo, as shown in FIG. 7. As such, a ring oscillator (presence in the conventional way) is not required for generating a reference signal of 50% duty cycle. Moreover, it can accelerate the convergence rate, and the variation of the feedback signal Vf is small.

Figure 12A:
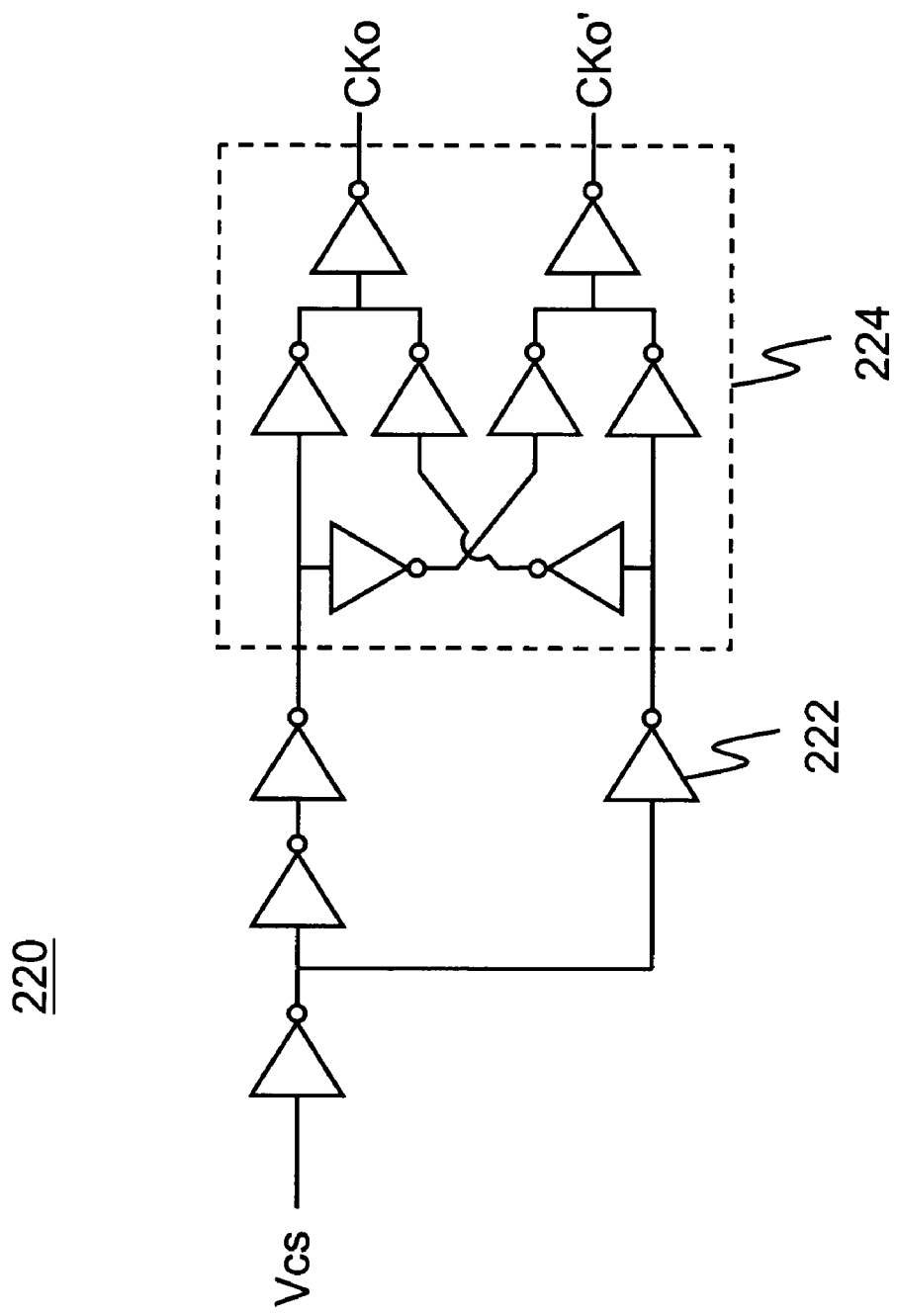
FIG. 12A is a general structural view of the buffer module depicted in FIG. 7 according to an embodiment.

In one embodiment, the buffer module 220 is mainly formed by several buffers 222, in which a phase-blending module 224 is used to generate the output clock CKo and a complementary signal CKo', as shown in FIG. 12A. There is a 180° phase difference between the output clock CKo and the complementary signal CKo'. A phase-blending technology is used to generate complementary signals for ensure that the skew, which is generated when the process migrates or the delay time of two signals are poorly designed, can be corrected.

Figure 12B:
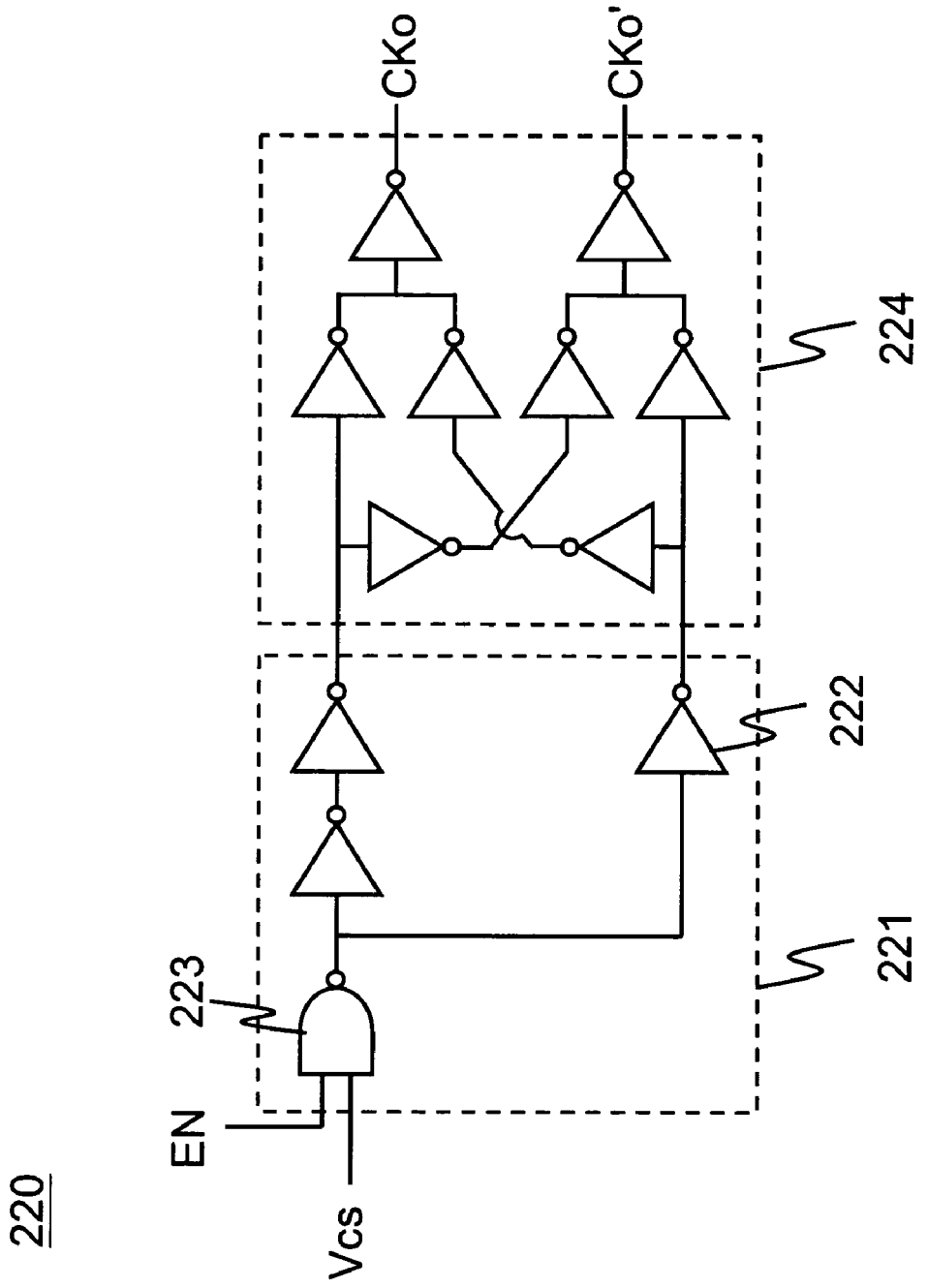
FIG. 12B is a general structural view of the buffer module depicted in FIG. 7 according to another embodiment.

In another embodiment, the buffer module 220 further includes an odd-stage buffer chain 221, as shown in FIG. 12B. In the buffer chain 221, the first stage is an NAND gate 223, for determining the original value of the PWCL for clock with any pulse-width ratio within a wide range. For example, when the enable signal EN received by the NAND gate 223 is 0, the NAND gate 223 outputs "logic 1", and then the operation of the PWCL for clock with any pulse-width ratio within a wide range is stopped. Otherwise, when the enable signal EN received by the NAND gate 223 is 1, the PWCL for clock with any pulse-width ratio within a wide range begins to operate normally.

Programmable Charge Pump

Figure 13:
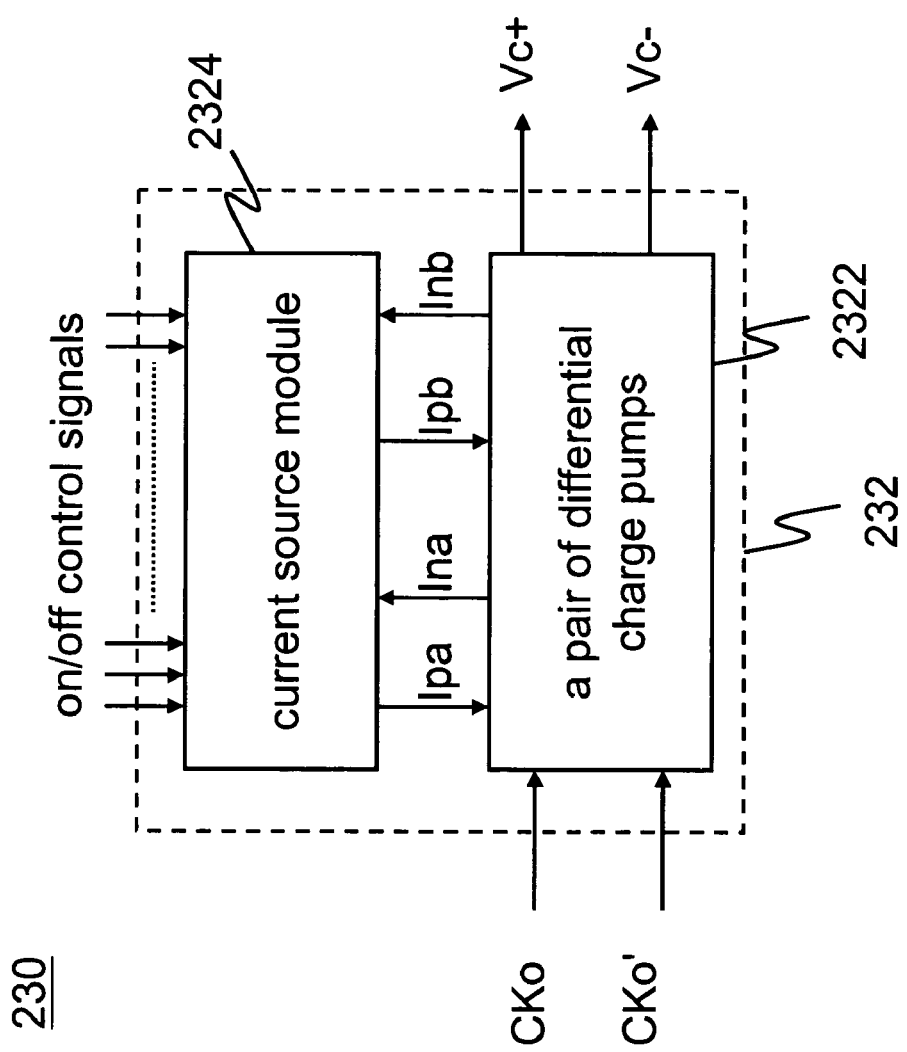
FIG. 13 is a general structural view of the programmable charge pump depicted in FIG. 7 according to the first embodiment.

Referring to FIG. 13, the programmable charge pump 230 has a digital-to-current ratio converter 232. The digital-to-current ratio converter 232 controls the current-switching of a current source module 2324 therein according to the on/off control signals, thereby adjusting the ratio of charge to discharge of a pair of differential charge pumps 2322 therein, such that the pair of differential charge pumps 2322 adjusts the potentials of the first comparative signal Vc+ and the second comparative signal Vc− according to the output clock CKo, complementary signal CKo', and the ratio of charge to discharge. The current-switching of the current source module 2324 can be changed by changing the on/off control signals, for adjusting the ratio of charge to discharge, thus achieving the output signal with any pulse-width ratio.

Figure 14:
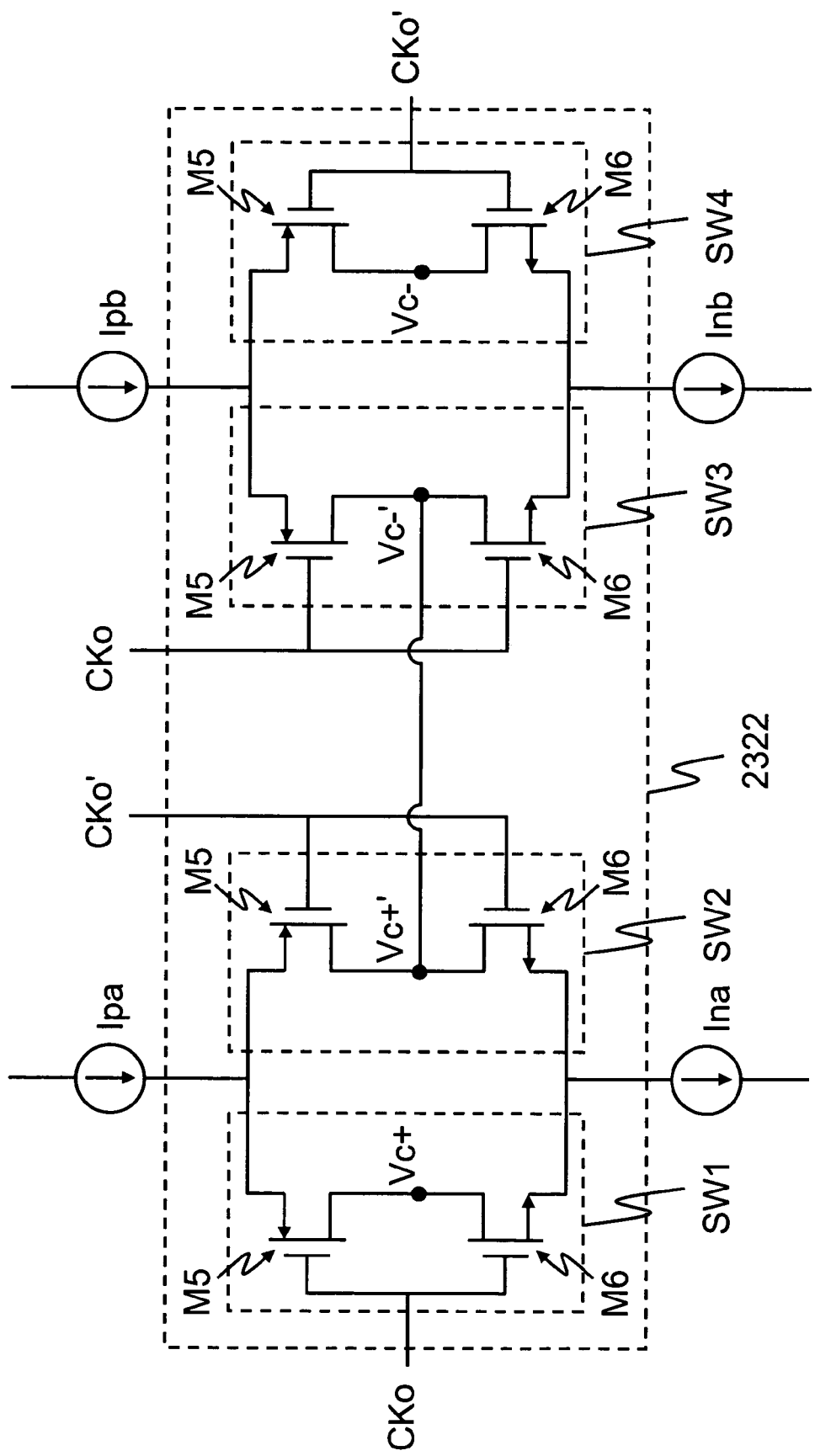
FIG. 14 is a general structural view of the pair of differential charge pumps depicted in FIG. 13 according to the first embodiment.

The pair of differential charge pump pairs 2322 has four switch units (namely, a first switch unit SW1, a second switch unit SW2, a third switch unit SW3, and a fourth switch unit SW4 below), wherein each switch unit has a charge switch M5 and a discharge switch M6 whose drains are connected to each other, as shown in FIG. 14.

The current source Ipa of the current source module is connected to the charge switches M5 of the first switch unit SW1 and the second switch unit SW2. The current source Ipb is connected to the charge switches M5 of the third switch unit SW3 and the fourth switch unit SW4. The current source Ina is connected to the discharge switches M6 of the first switch unit SW1 and the second switch unit SW2. The current source Inb is connected to the discharge switches M6 of the third switch unit SW3 and the fourth switch unit SW4. The charge current from the current source Ipa is approximately equal to the discharge current from the current source Inb, while the charge current from the current source Ipb is approximately equal to the discharge current from the current source Ina. The output clock CKo is input from the gates of the charge switches M5 and the discharge switches M6 of the first switch unit SW1 and the third switch unit SW3, while the complementary signal CKo' is input from the gates of the charge switches M5 and the discharge switches M6 of the second switch unit SW2 and the fourth switch unit SW4. The drains of the charge switch M5 and the discharge switch M6 of the second switch unit SW2 are connected to the drains of the charge switch M5 and the discharge switch M6 of the third switch unit SW3. The drains of the charge switch M5 and the discharge switch M6 of the first switch unit SW1 and the fourth switch unit SW4 are connected to the input of the next stage (i.e., LPF).

The complementary relation of the circuit is adopted to correct errors, for making the third comparative signal Vc−' with a rising potential connected to the fourth comparative signal Vc+' with a dropping potential when different conditions are required by the charge/discharge currents (for example, $i_{pa}=i_{nb}<i_{pb}=i_{na}$). Therefore, the charge current on the left side can be directly discharged via the discharge path on the right side, and vice versa. As a result, the potentials of the third comparative signal Vc−' and the fourth comparative signal Vc+' can be kept at a balanced state between charge and discharge. Thus, when the duty cycle of the output clock CKo (and the complementary signal CKo') is not 50%, the current sources can still operate precisely and stably. Each of the charge switches M5 and the discharge switches M6 can be a MOS.

Figure 15A:
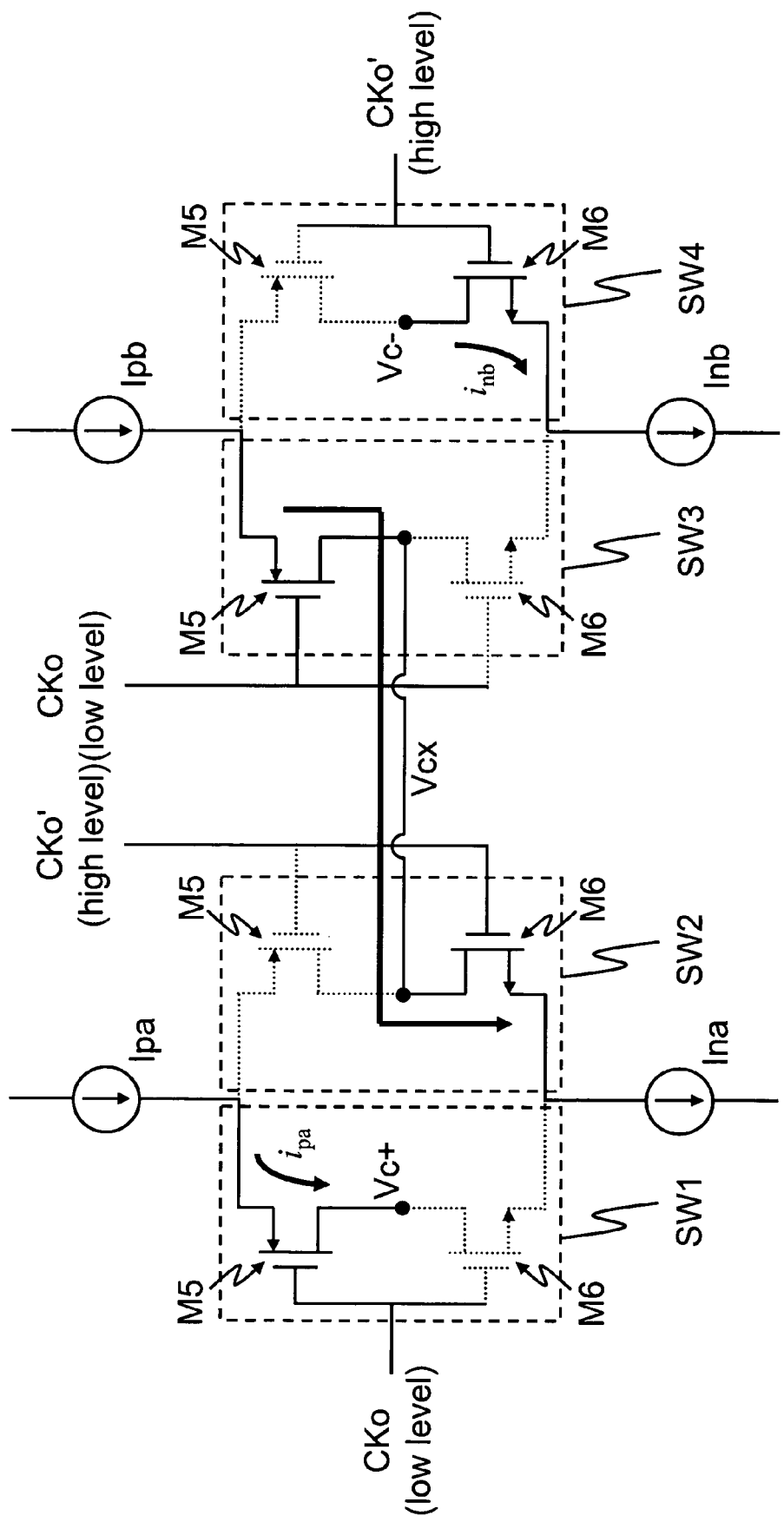
FIGS. 15A and 15B are schematic operational views of the pair of differential charge pumps depicted in FIG. 14.
Figure 15B:
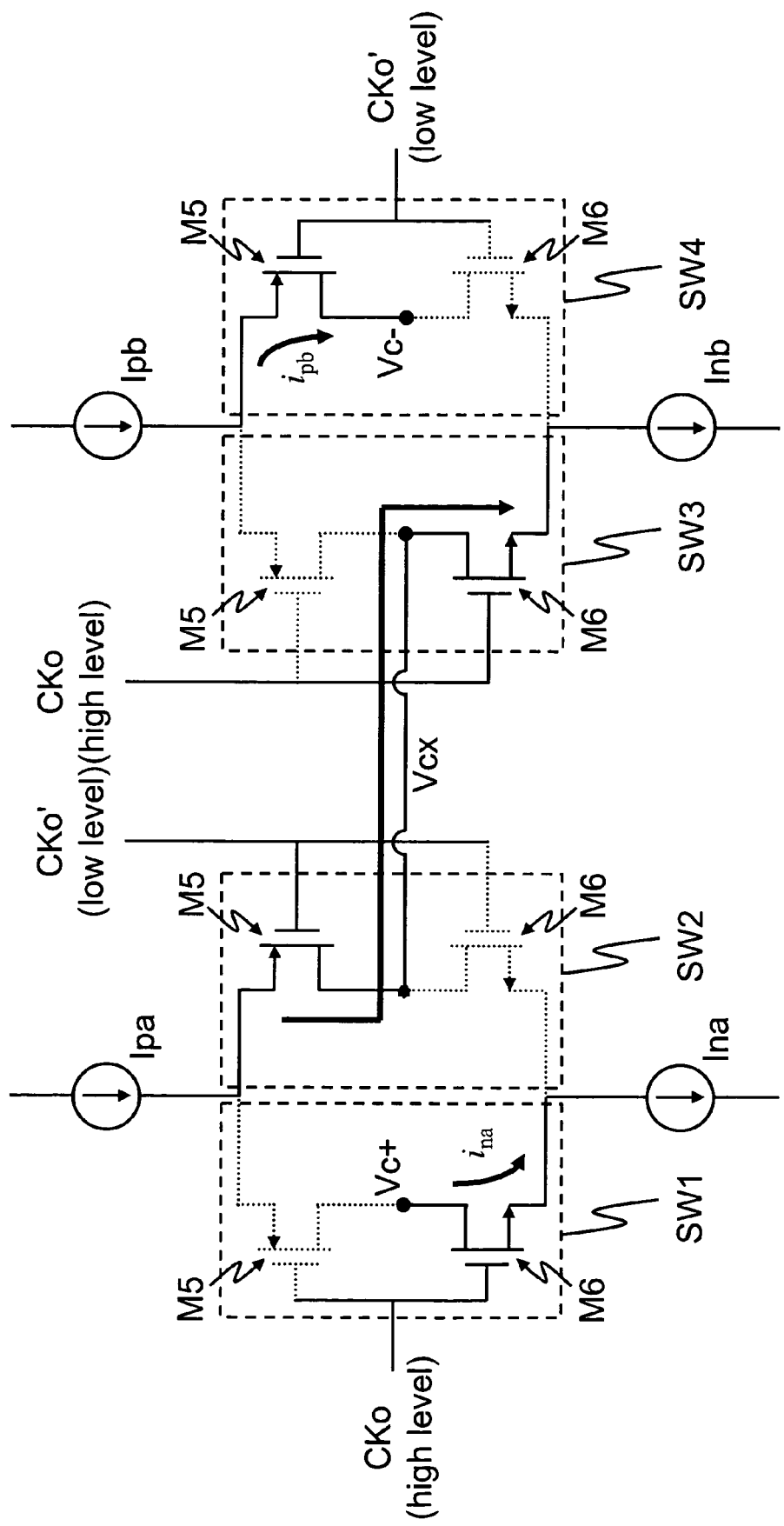

For example, when the output clock CKo is of a low level (i.e., the complementary signal CKo' is of a high level), the charge switches M5 of the first switch unit SW1 and the third switch unit SW3 are turned on, while the discharge switches M6 thereof is turned off, such that the current $i_{pa}$ from the current source Ipa passes through the charge switch M5 of the first switch unit SW1 for charging the first comparative signal Vc+. Meanwhile, as the complementary signal CKo' is of a high level, the charge switches M5 of the second switch unit SW2 and the fourth switch unit SW4 is turned off, and the discharge switches M6 is turned on, such that the current $i_{nb}$ passes through the discharge switch M6 of the fourth switch unit SW4 to the current source Inb, for discharging the comparative signal Vc−. The charge path of the third switch unit SW3 on the right side is guided to the discharge path of the second switch unit SW2 on the left for discharging, as shown in FIG. 15A. On the contrary, when the output clock CKo is of a high level (i.e., the complementary signal CKo' is of a low level), the charge switches M5 of the first switch unit SW1 and the third switch unit SW3 are turned off, and the discharge switches M6 is turned on, such that the current $i_{na}$ passes through the discharge switch M6 of the first switch unit SW1 to the current source Ina, thereby discharging the first comparative signal Vc+. Meanwhile, as the complementary signal CKo' is of a low level, the charge switches M5 of the second switch unit SW2 and the fourth switch unit SW4 is turned on, and the discharge switches M6 is turned off, such that the current $i_{pb}$ from the current source Ipb passes through the charge switch M5 of the fourth switch unit SW4, thereby charging the first comparative signal Vc+. The charge path of the second switch unit SW2 on the left side is guided to the discharge path of the third switch unit SW3 on the right for discharging, as shown in FIG. 15B. As such, no matter how the pulse width varies, the potential Vcx is kept constant for stabilizing the current. When the loop is locked, the potentials of the first comparative signal Vc+ and the second comparative signal Vc− are constant as desired. Therefore, the total charges of the charge current charged into the pair of differential charge pumps are equal to that of the discharge current discharged from the pair of differential charge pumps. Thus, the output clocks CKo with different pulse-width ratio can be obtained by changing the ratio of charge to discharge of the pair of differential charge pumps.

Therefore, the resolution can meet the desired specification of output pulse-width ratio within the wide range (for example, 1%~99%).

Figure 16:
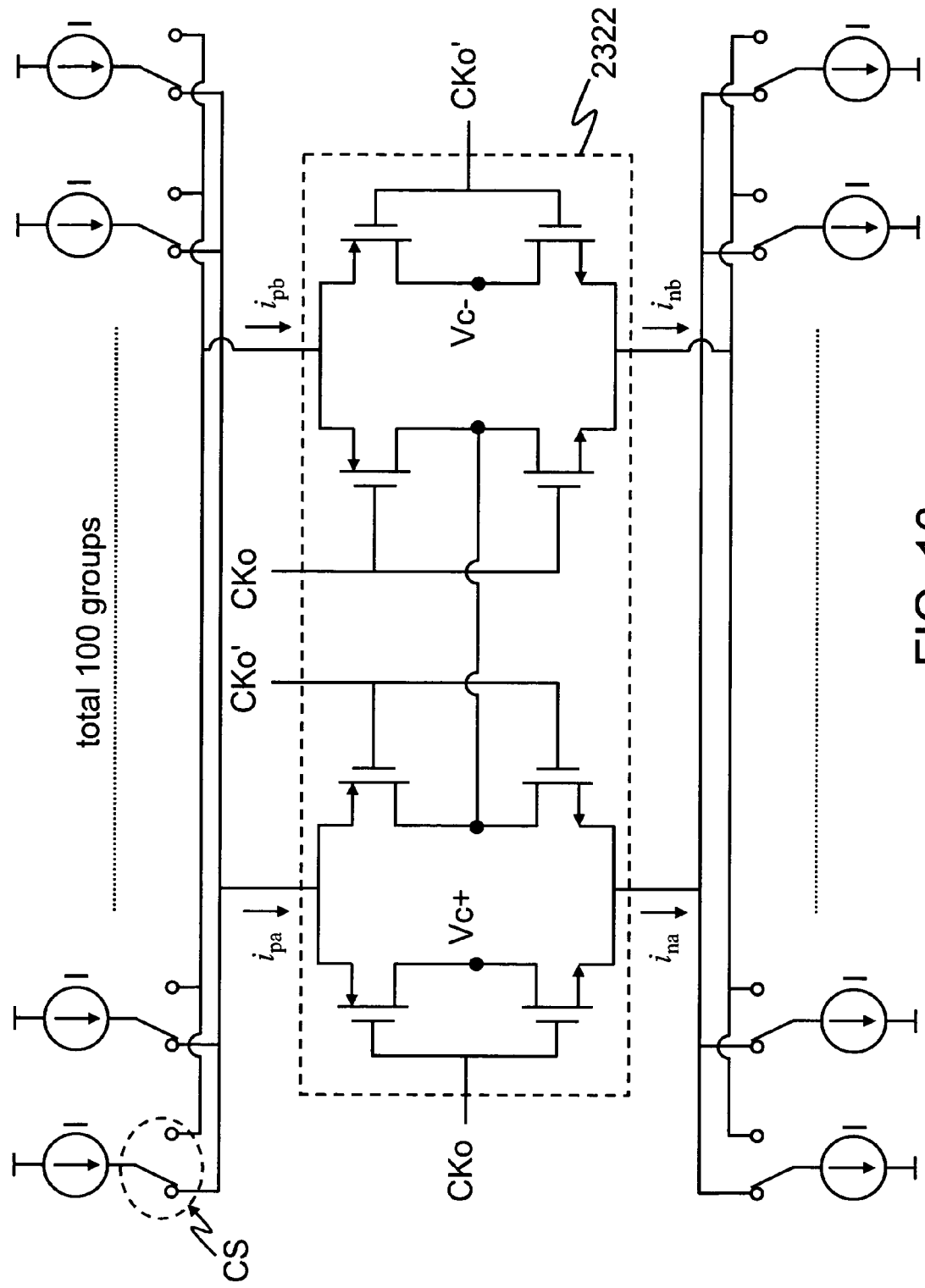
FIG. 16 is a general structural view of the programmable charge pump depicted in FIG. 7 according to the second embodiment.

Besides, in order to improve the resolution of the circuit, the current source is divided into K groups (K is a positive integer). For example, referring to FIG. 16, the current source is divided into 100 groups (i.e., the desired specification is set to be resolution of 1%). In other words, the 100 groups of control switches CS are used to control the switching of the current I, so as to select the required ratio of charge to discharge (i.e., the aforementioned $i_{pa}:i_{na}$ and $i_{pb}:i_{nb}$), wherein $i_{pa}=i_{nb}$, $i_{na}=i_{pb}$, the $i_{pa}:i_{na}$ and the $i_{pb}:i_{nb}$ are opposite ratios of charge to discharge. When the loop is locked, the potentials of the first comparative signal Vc+ and the second comparative signal Vc− are constant as desired, i.e., generating the output clock with any pulse-width ratio is achieved.

Therefore, the resolution can be improved by increasing the total number of the divided groups of the current source and correspondingly generating the same number of groups of the on/off control signals.

Figure 17:
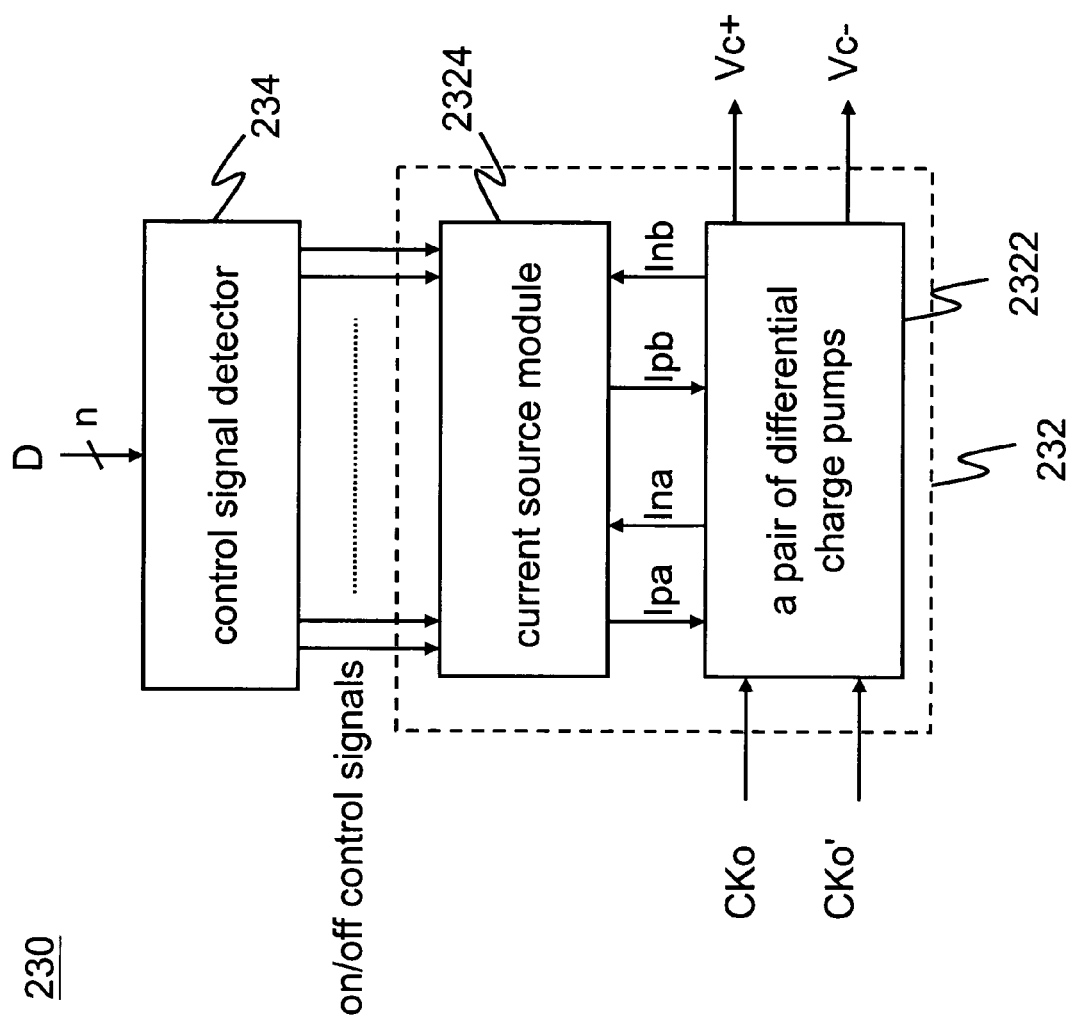
FIG. 17 is a general structural view of the programmable charge pump depicted in FIG. 7 according to the third embodiment.

The on/off control signals for adjusting the control switches CS are generated by a control signal detector 234 according to an n-bit digital control signal Dn, as shown in FIG. 17.

K is $2^n$, and n is an integer. The generated on/off control signals are changed by adjusting the input digital control signal Dn, so as to change the ratio of charge to discharge, thereby generating the output clock with any pulse-width ratio.

In the following part, the structure and operation of the control signal detector is further illustrated. For example, a 7-bit digital control signal is converted into 100 groups of on/off control signals for controlling switches for example. In practice, the on/off control signals for 128 ($=2^7$) groups of control switches can be obtained by decoding the 7-bit digital control signal, and they can respectively control the groups of the current sources, thereby achieving a resolution of 1/128%. Likewise, as for an n-bit digital control signal, a resolution of $1/2^n$% is obtained. However, as the desired specification is set to be a resolution of 1%, though a 7-bit digital control signal is adopted, only the on/off control signals for 100 groups of the control switches are needed after decoding, and thus only the on/off control signals for 100 groups of the control switches are shown in the accompanying related drawings.

Figure 18:
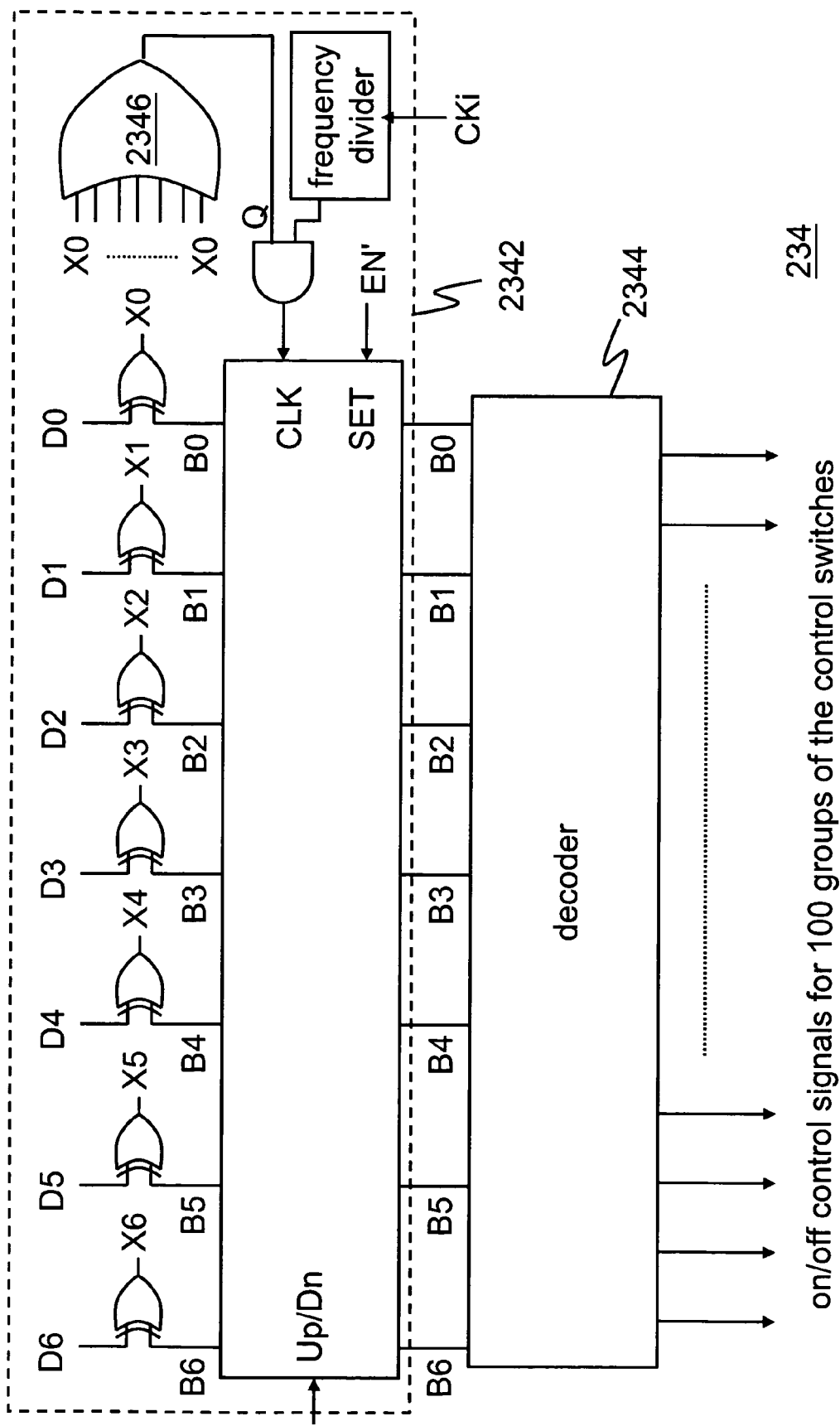
FIG. 18 is a general structural view of the control signal detector depicted in FIG. 17 according to an embodiment.

Referring to FIG. 18, the control signal detector 234 has a counter 2342 and a decoder 2344.

The counter 2342 is formed with several logic elements and an up/down counter, as shown in FIG. 18. The up/down counter can be set according to an enable signal EN', and count upward or downward according to the count control signal Up/Dn, thereby generating count signals B0~B6. Each logic element receives one of the digital control signals D0~D6 and one of the count signals B0~B6, and carries out a logical decision based on the received digital control signals D0, D1 . . . D5, or D6 and count signals B0, B1 . . . B5, or B6, so as to output a logic signal X0, X1 . . . X5, or X6. When an actuating signal CLK is a periodic signal, the count begins to generate the count signals B0~B6. Assuming that the digital control signals D0~D6 are the digital control signals in association with desired pulse width, when the count is proceed till the count signals B0~B6 is the same as the digital control signals D0~D6, the logic signals X0~X6 input to an exclusive-OR (XOR) gate 2346 are all 0. Therefore, the output logic signal Q is 0, and the actuating signal CLK input into the up/down counter is 0 constantly. Then, the count stop, i.e., the counter 2342 outputs constant count signals B0~B6.

As such, the ratio of charge to discharge can be selected freely by adjusting the digital control signals D0~D6 and the digital control signals are changed during the lock in time, so as to change the ratio of charge to discharge of the pair of differential charge pumps, thus accelerating the lock in time required by the circuit. Assuming that the original value of the feedback signal Vf is 0V, the feedback signal Vf rises to a fixed potential value when the correction procedure proceeds via the loop to provide the signal with a fixed pulse width by. If the control digital signals are controlled first to make the charge current larger than the discharge current in the programmable charge pump, the rising speed of the feedback signal Vf can be accelerated and the digital control signals are fixed after the desired pulse-width ratio is obtained.

The decoder 2344 is a 7-bit decoder, for converting the input count signals B0~B6 into the on/off control signals for controlling switches of 100 groups of the control switches of the current source module.

Figure 19:
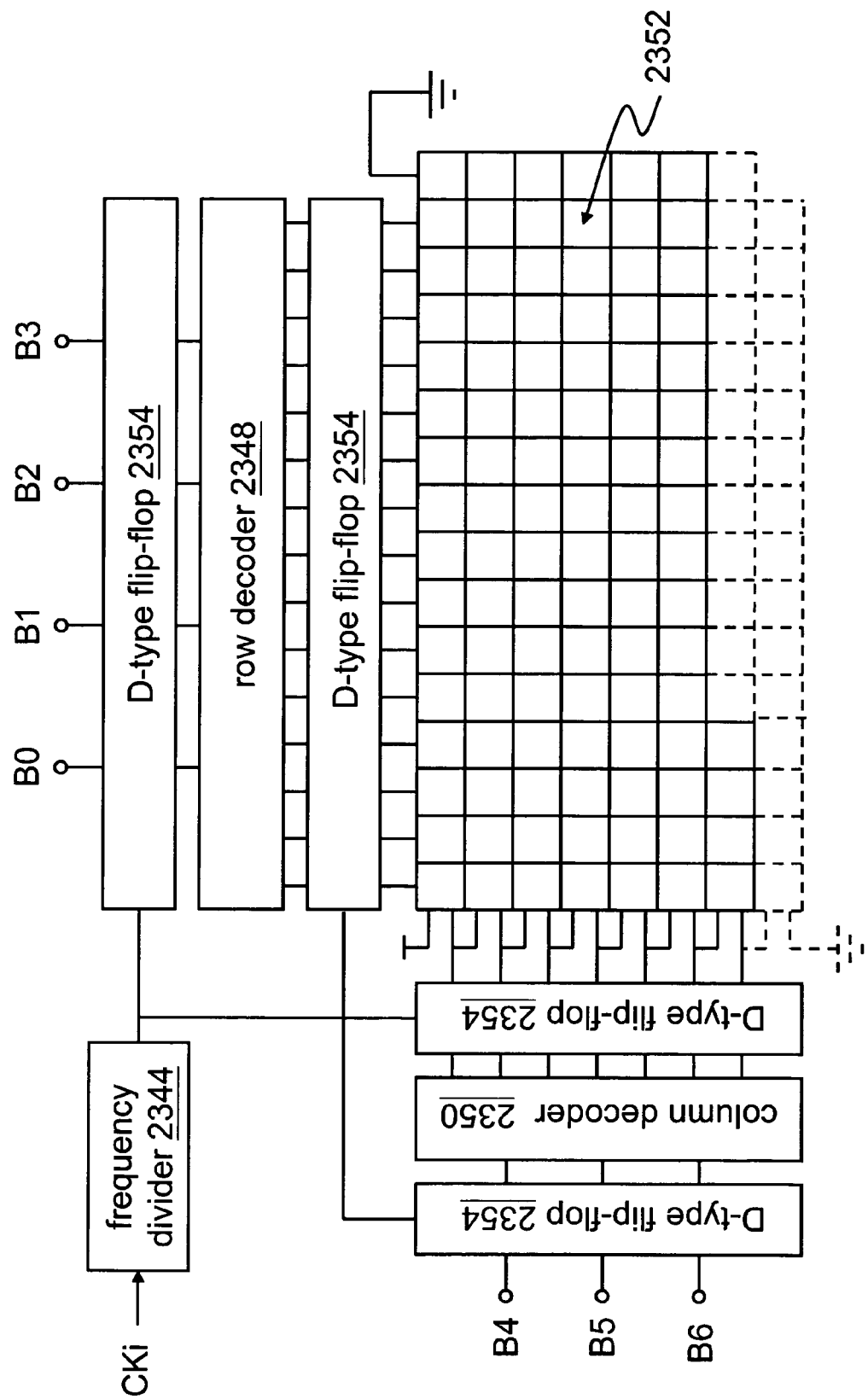
FIG. 19 is a general structural view of the decoder depicted in FIG. 18 according to an embodiment.

Referring to FIG. 19, the decoder 2344 adopts a 4-to-15 thermometer decoder as the row decoder 2348, and a 3-to-7 thermometer decoder as the column decoder 2350. The line/row signals are cross-connected to 100 groups of local decoders 2352, for converting the input 7-bit count signals B0~B6 into 100 groups of thermometer codes (i.e., the on/off control signals) to be output, so as to control various ratios of charge to discharge of the current. A D-type flip-flop 2354 is added to synchronize the signals. As the structures and operational principles of the thermometer decoder, local decoder, and D-type flip-flop are known to those skilled in the art, they will not be described herein.

Figure 20:
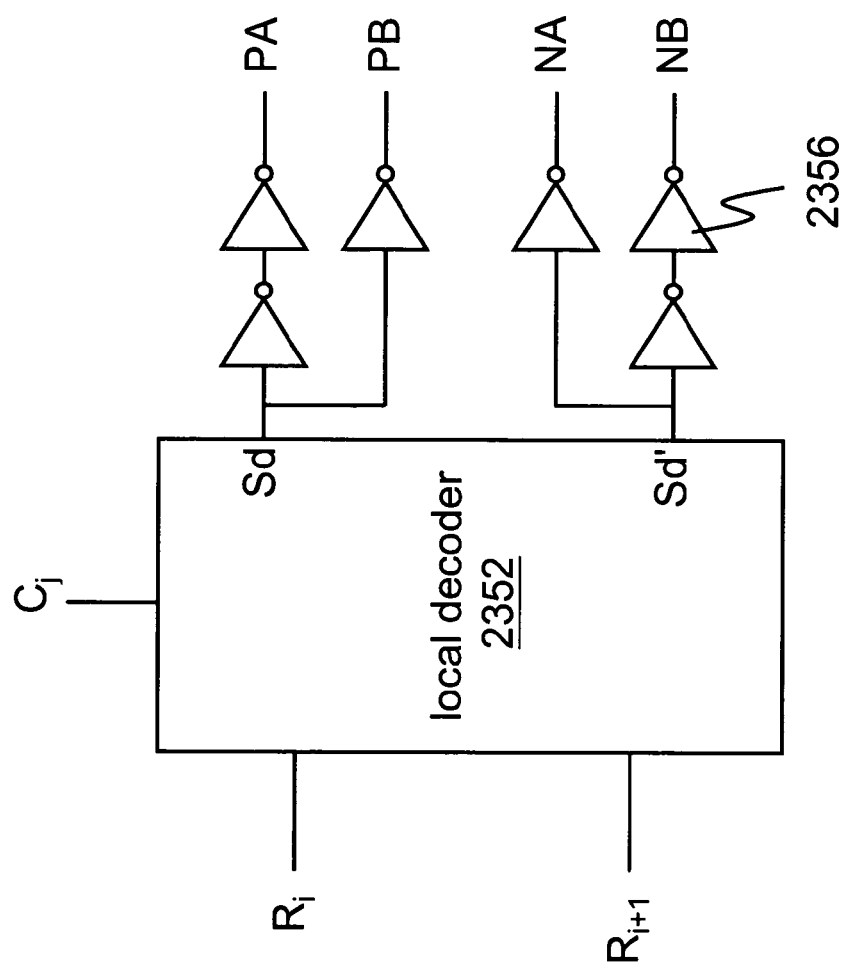
FIG. 20 is a general structural view of the local decoder depicted in FIG. 18 according to an embodiment.
Figure 21:
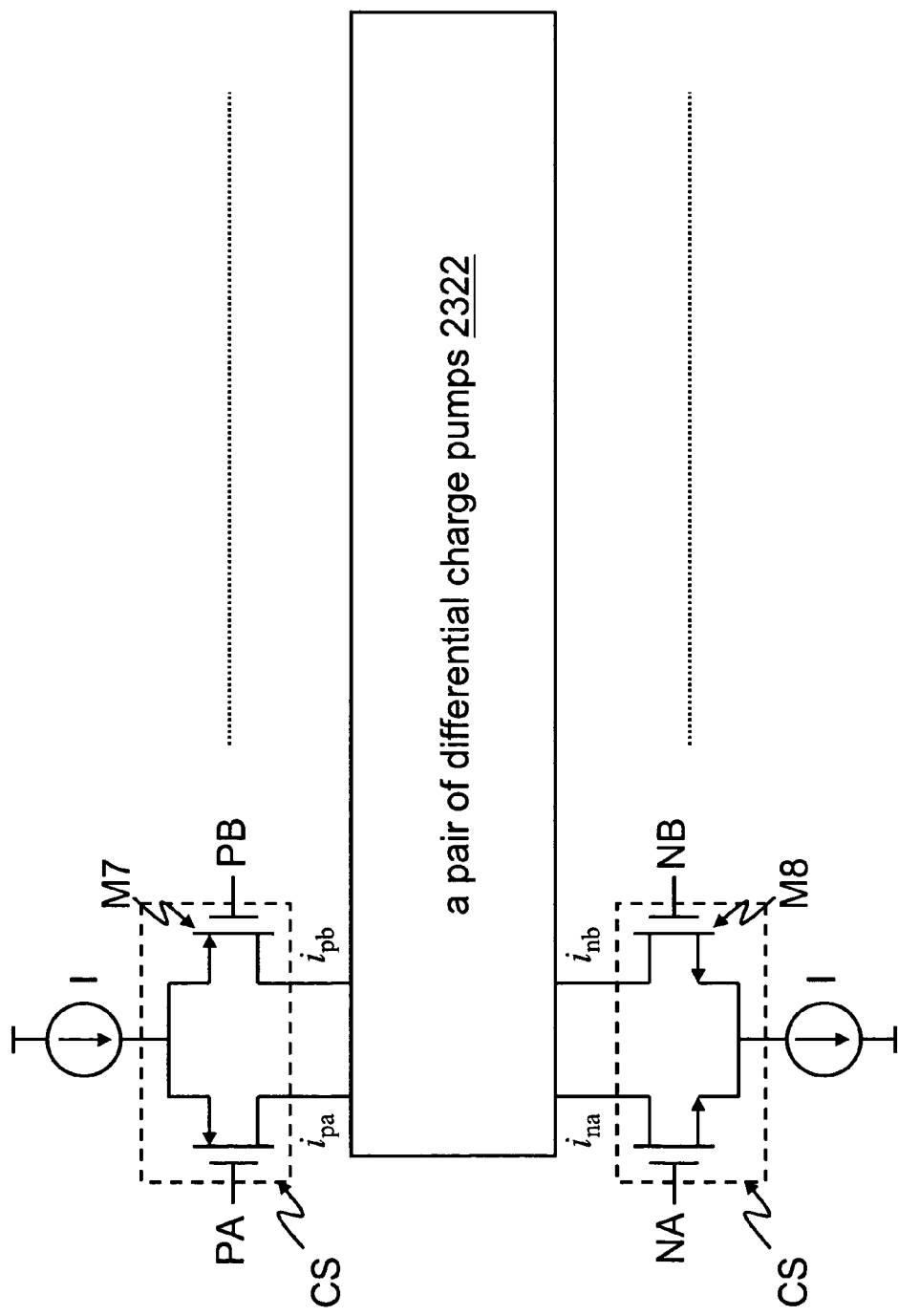
FIG. 21 is a general structural view of the current source module depicted in FIG. 17 according to an embodiment.

Each local decoder 2352 can implement the logic operation of Sd=$R_{i+1}$+$R_i$×$C_j$, and the signals Sd and Sd' are complementary to each other, wherein $C_j$ represents a signal from the row decoder 2348, and $R_{i+1}$, $R_i$ represent signals from the column decoder 2350. In order to minimize the surge error caused by switching, the signals Sd, Sd' output by the local decoder 2352 are processed by a buffer 2356 designed with a specific transistor ratio to generate switch signals PA, PB, NA, and NB (i.e., a group of on/off control signals), such that the switch signals PA, PB are transformed at a low potential to control the on/off of the PMOS M7, and the switch signals NA, NB are transformed at a high potential to control the on/off of the NMOS M8, as shown in FIGS. 20, 21. As such, the surge caused during switching can be reduced. In other words, the on/off of the PMOS M7 are respectively controlled by the switch signals PA, PB, thereby providing charge currents $i_{pa}$, $i_{pb}$. The on/off of the NMOS M8 are respectively controlled by the switch signals NA, NB, thereby providing discharge currents $i_{na}$, $i_{nb}$.

Figure 22A:
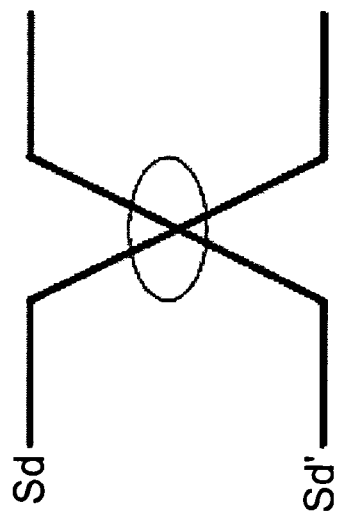
FIG. 22A is the output waveform of the local decoder depicted in FIG. 20.
Figure 22B:
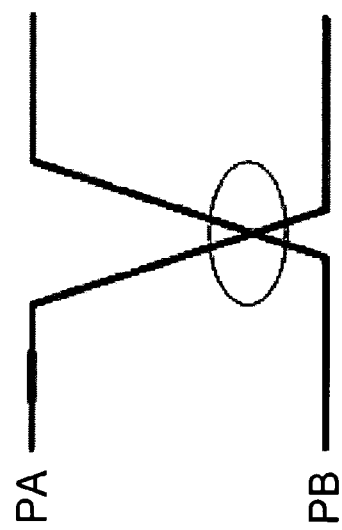
FIGS. 22B and 22C are the waveforms of the output of the local decoder after being buffered by a buffer depicted in FIG. 20.
Figure 22C:
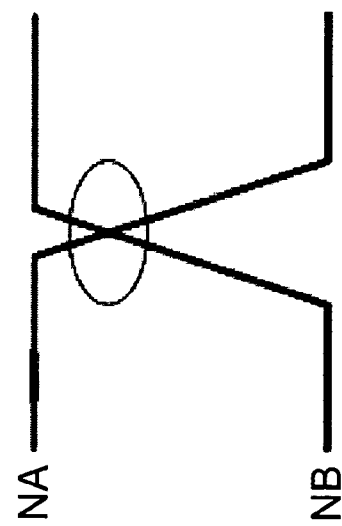
Figure 23B:
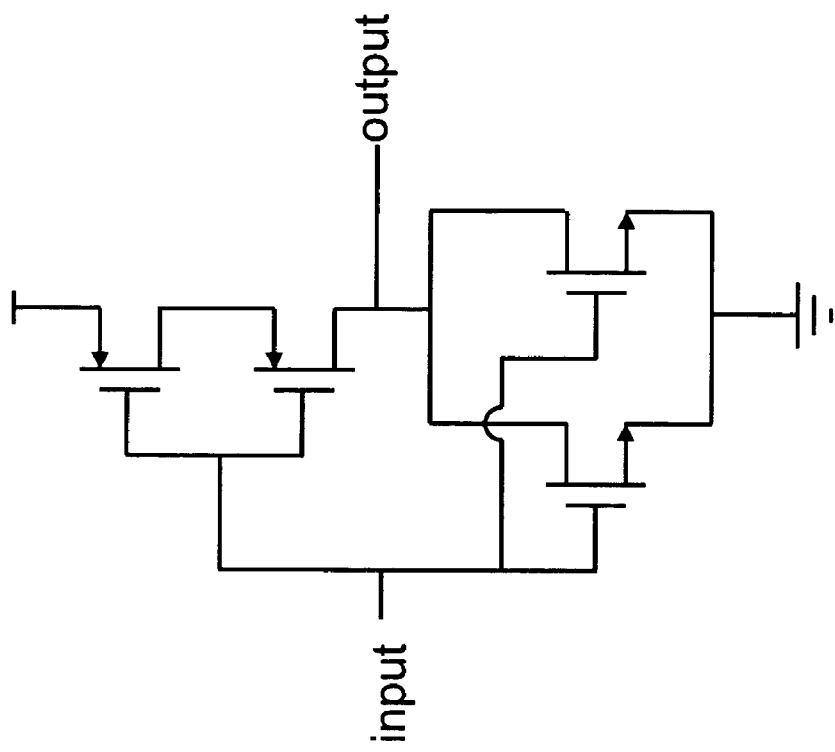
FIG. 23B is a general structural view of the buffer depicted in FIG. 20 according to another embodiment.
Figure 23A:
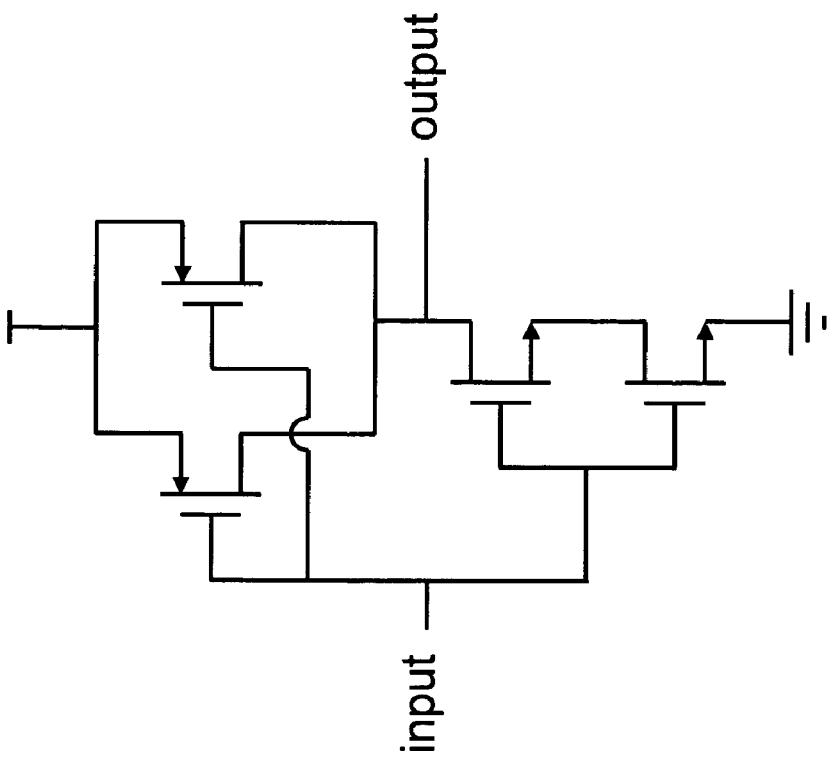
FIG. 23A is a general structural view of the buffer depicted in FIG. 20 according to an embodiment.

The local decoder can accomplish the logic operation of Sd=$R_{i+1}$+$R_i$×$C_j$ via a complementary pass-transistor logic (CPL) circuit, to make the logic conversion of the signals Sd, Sd' at the ½ potential, with a waveform as shown in FIG. 22A. Besides, the switch signals PA, PB transformed at a low potential can be generated after the signals Sd, Sd' are buffered by the buffer 2356 designed with a specific transistor ratio, with a waveform as shown in FIG. 22B, for controlling the on/off of the PMOS M7. The switch signals NA, NB transformed at a high potential are also generated, with a waveform as shown in FIG. 22C, for controlling the on/off of the NMOS M8. As such, the current source passes through the junction of the current sources at any given time. Therefore, the voltage drop value can be relatively reduced, i.e., the potential at the drain is an approximately fixed value, thereby preventing the current source from being affected by the channel length modulation. As the structure and operational principle of the CPL circuit are known to those skilled in the art, they will not be described herein. The circuit structure of the buffer 2356 designed with a specific transistor ratio is shown in FIGS. 23A, 23B, where a reverser with a low charge speed and a quick discharge speed is shown in FIG. 23A and a reverser with a quick charge speed and a low discharge speed is shown in FIG. 23B. The buffer 2356 is formed by transistors with specific size proportions. As the operational principle of the buffer 2356 is known to those skilled in the art, it will not be described herein.

LPF

The LPF is used to convert the current of the programmable charge pump into a voltage value, and the selection of a gain value thereof may affect the stability of the whole system. The programmable charge pump has the pair of differential charge pumps, so two LPFs are required to convert the currents output by the differential charge pumps into the voltage values. When the system applies to the output clock with any pulse-width ratio within the wide range, it using a 1-stage LPF is not stable. For this reason, a 2-stage LPF is used to improve the stability of the system.

Figure 24:
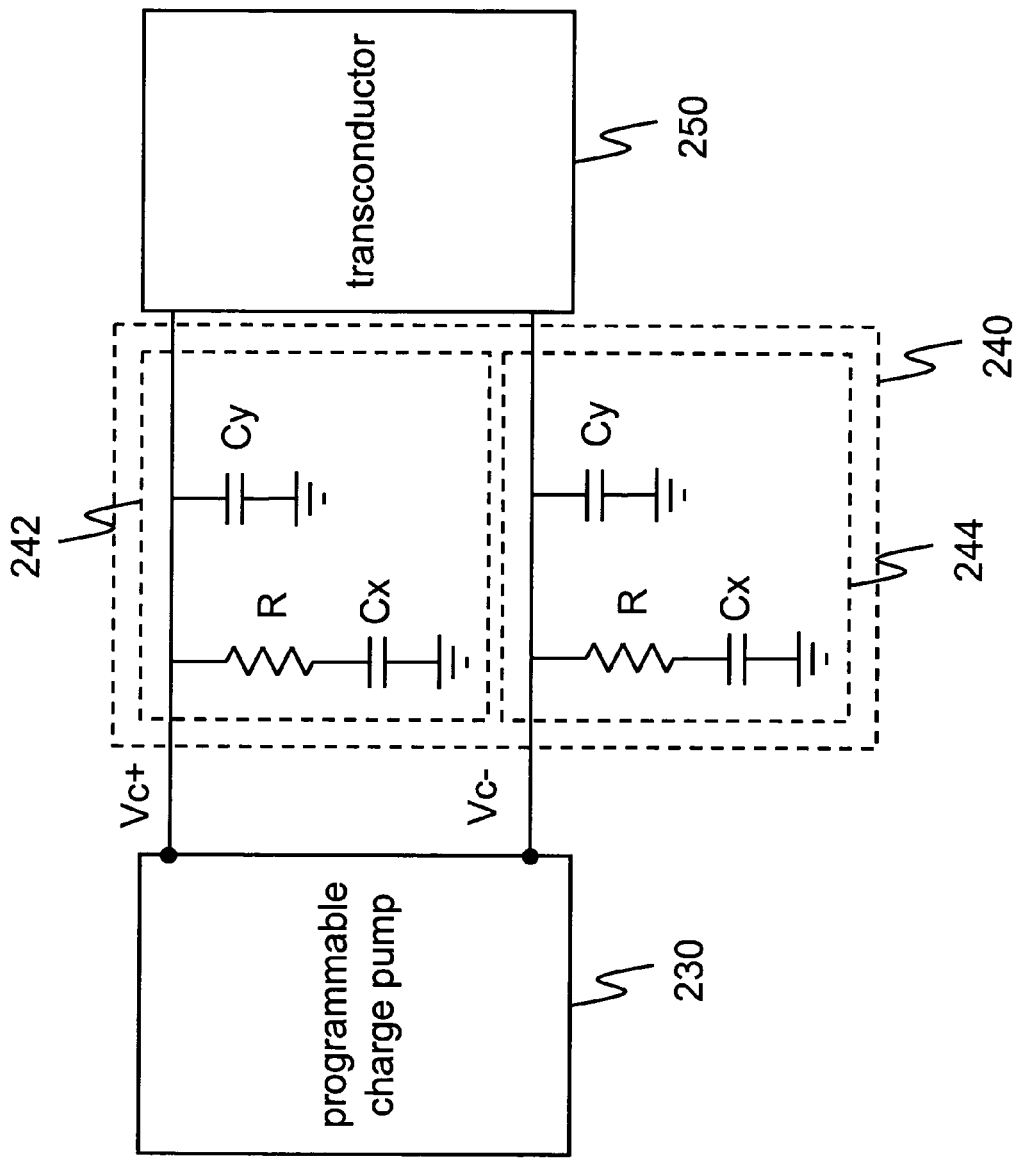
FIG. 24 is a general structural view of the LPF depicted in FIG. 7 according to the first embodiment.

Referring to FIG. 24, each 2-stage LPFs 242, 244 has two capacitors Cx, Cy, and a resistor R. One end of the resistor R is coupled between the programmable charge pump 230 and the transconductor 250, while the capacitor Cx is coupled between the other end of the resistor R and the ground. The capacitor Cy is connected in parallel to the resistor R and the capacitor Cx, as a bypass capacitor. Therefore, the first comparative signal Vc+ and the second comparative signal Vc− generated by the programmable charge pump 230 are respectively input into LPFs 242, 244 to be filtered.

Figure 25:
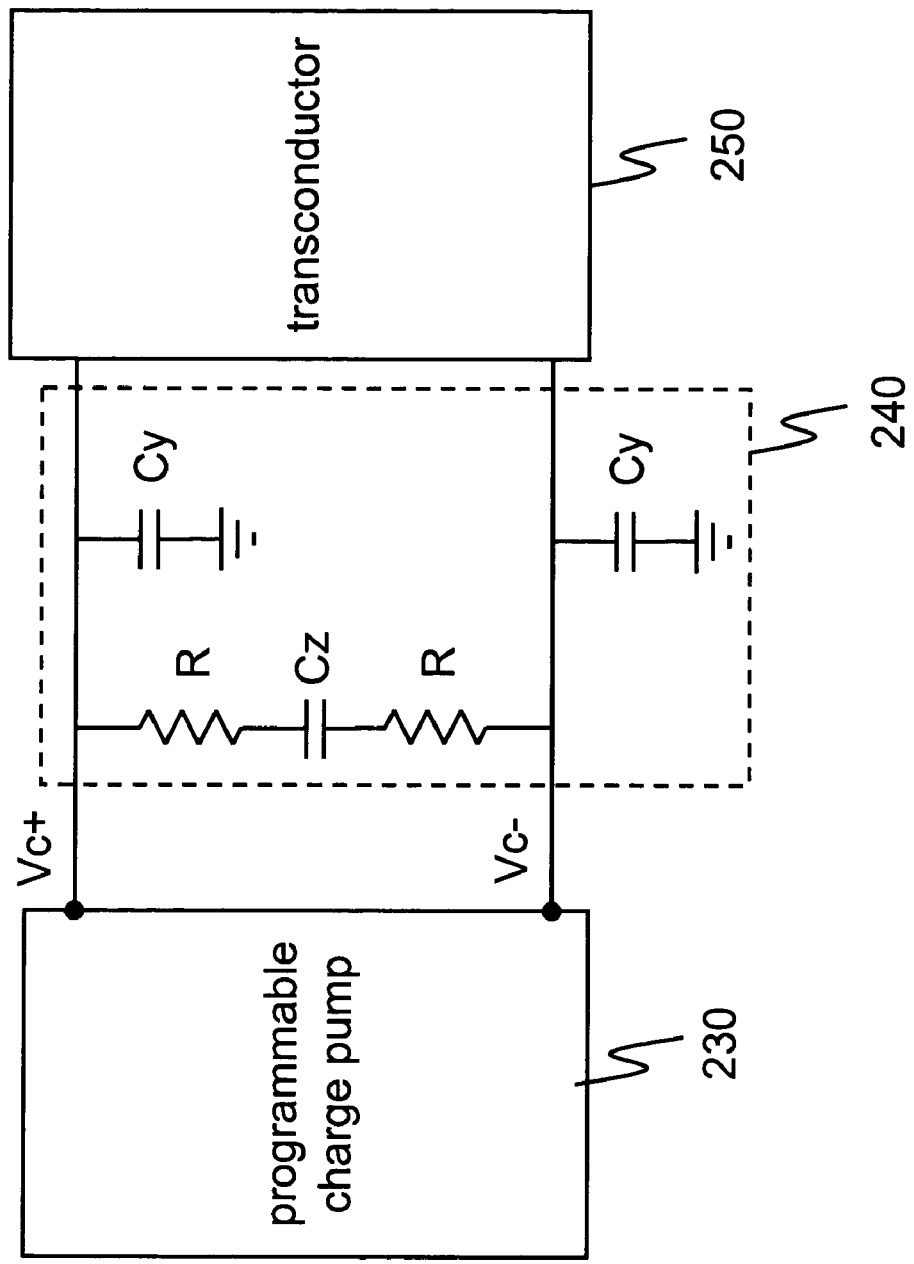
FIG. 25 is a general structural view of the LPF depicted in FIG. 7 according to the second embodiment.

In another embodiment, as the first and the second comparative signal are complementary, the LPF can be achieved by a layout of the cross capacitor. Referring to FIG. 25, one end of the resistor R is connected between the output of the first comparative signal Vc+ of the programmable charge pump 230 and the transconductor 250, and one end of the other resistor R is connected between the output of the second comparative signal Vc− of the programmable charge pump 230 and the transconductor 250. A cross capacitor Cz couples the other ends of the resistors R together. Two capacitors Cy are respectively connected between the output of the first comparative signal Vc+ of the programmable charge pump 230 and the ground, and between the output of the second comparative signal Vc− of the programmable charge pump 230 and the ground. As a result, for the transconductor of the next stage, the capacitor is connected between the first comparative signal Vc+ and the second comparative signal Vc−, thereby causing a virtual short at both inputs of the transconductor when the gain value of the transconductor is large enough, so as to reduce the voltage difference between the first comparative signal Vc+ and the second comparative signal Vc−. Moreover, the capacitor Cy as a bypass capacitor is used to reduce the current passing through the capacitor Cz. Therefore, not only the voltage difference between the two comparative signals is not increased, but also the stability of the circuit is improved. Furthermore, the desired overall capacitance can also be reduced, i.e., the capacitance of the capacitor Cz is half of the capacitance of the capacitor Cx.

Transconductor

Referring to FIG. 7, the transconductor 250 is used to compare the first comparative signal Vc+ and the second comparative signal Vc−, thereby rising or dropping the feedback signal Vf to feed it back the input control stage 210, so as to adjust the duty cycle of the output clock CKo. The transconductor can be implemented by an operational amplifier. As the structure and operational principle of the operational amplifier are known to those skilled in the art, they will not be described herein.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A pulse-width control loop (PWCL) for clock with any pulse-width ratio within a wide range, comprising:
an input control stage, for receiving an input clock and a feedback signal, and changing the pulse-width ratio of the input clock according to the feedback signal so as to generate a modulating signal;
a buffer module, for buffering and reversing the modulating signal, thereby generating an output clock and a complementary signal, wherein the phases of the output clock and the complementary signal are opposite to each other;
a programmable charge pump, comprising:
a first differential charge pump;
a second differential charge pump; and a current source module, for adjusting the ratio of charge to discharge of the pair of differential charge pumps;

wherein, the first and the second differential charge pumps are used to adjust the potentials of a first comparative signal and a second comparative signal based on the output clock, the complementary signal, and the ratio of charge to discharge;

at least one 2-stage LPF, for filtering the first and the second comparative signals; and a transconductor, for comparing the first and the second comparative signals, thereby adjusting the feedback signal to be fed back the input control stage.

2. The PWCL for clock with any pulse-width ratio within a wide range according to claim 1, wherein the first differential charge pump comprises
a first switch unit, connected to the current source module, for adjusting the potential of the first comparative signal according to the output clock and the ratio of charge to discharge, and
a second switch unit, connected to the current source module, for receiving the complementary signal;

the second differential charge pump comprises
a third switch unit, connected to the current source module, for receiving the output clock, and
a fourth switch unit, connected to the current source module, for adjusting the potential of the second comparative signal according to the complementary signal and the ratio of charge to discharge; and
the output of the second switch unit is connected to the output of the third switch unit.

3. The PWCL for clock with any pulse-width ratio within a wide range according to claim 2, wherein each of the first, second, third, and fourth switch units has a charge switch and a discharge switch, a drain of the charge switch being connected to a drain of the discharge switch, a source of the charge switch and a source of the discharge switch being connected to the current source module; and a gate of the charge switch and a gate of the discharge switch being connected to each other for receiving one of the output clock and the complementary signal.

4. The PWCL for clock with any pulse-width ratio within a wide range according to claim 1, wherein the current source module comprises:

at least one group of current sources configured to charge or discharge current; and at least one groups of control switches, respectively corresponding to the at least one group of current sources, wherein each group of the control switches is used to control the current-switching of the corresponding group of current sources in accordance with a group of on/off control signals.

5. The PWCL for clock with any pulse-width ratio within a wide range according to claim 4, wherein each group of the control switches comprises:

two P-type metal oxide semiconductors (PMOSs), wherein the sources of the PMOSs are connected to the corresponding group of current sources, and the drains of the PMOSs are respectively connected to the first and the second differential charge pumps; and two N-type metal oxide semiconductors (NMOSs), respectively corresponding to the PMOSs, wherein the sources of the NMOSs are respectively connected to the group of current sources connected with the corresponding PMOSs, and the drains of the NMOSs are respectively connected to the first and the second differential charge pumps connected with the corresponding PMOSs;

wherein, the group of on/off control signals is put into the gates of the PMOSs and the NMOSs for controlling the on/off of the PMOSs and the NMOSs.

6. The PWCL for clock with any pulse-width ratio within a wide range according to claim 1, wherein the programmable charge pump further comprises:

a control signal detector, connected to the current source module, for generating K groups of on/off control signals according to an n-bit digital control signal, so as to control the current-switching of the current source module, wherein K is $2^n$ and n is an integer.

7. The PWCL for clock with any pulse-width ratio within a wide range according to claim 6, wherein the control signal detector comprises:

a counter, for counting according to the n-bit digital control signal, so as to generate a plurality of count signals; and a decoder, for converting the count signals into the on/off control signals.

8. The PWCL for clock with any pulse-width ratio within a wide range according to claim 7, wherein the counter comprises: an up/down counter and a plurality of logic elements for making a logical decision according the n-bit digital control signal and the output of the up/down counter, thereby controlling the counting of the up/down counter.

9. The PWCL for clock with any pulse-width ratio within a wide range according to claim 7, wherein the decoder is an n-bit decoder.

10. The PWCL for clock with any pulse-width ratio within a wide range according to claim 9, wherein the n-bit decoder comprises:

a row decoder, for converting a part of the count signals into a plurality of thermometer codes;

a column decoder, for converting the other part of the count signals into a plurality of thermometer codes; and K groups of local decoders, for generating the on/off control signals according to the thermometer codes;

wherein, the row decoder and the column decoder are cross-connected to the local decoders.

11. The PWCL for clock with any pulse-width ratio within a wide range according to claim 10, wherein each of the local decoders is connected to a plurality of buffers for buffering the output on/off control signals.

12. The PWCL for clock with any pulse-width ratio within a wide range according to claim 11, wherein each of the buffers comprises a plurality of transistors with specific size proportions to each other.

13. The PWCL for clock with any pulse-width ratio within a wide range according to claim 11, wherein the n-bit decoder further comprises a plurality of D-type flip-flops, for respectively synchronizing the count signals and the thermometer codes.

14. The PWCL for clock with any pulse-width ratio within a wide range according to claim 11, wherein each of the on/off control signals has a plurality of signals transformed at a high potential and a plurality of signals transformed at a low potential.

15. The PWCL for clock with any pulse-width ratio within a wide range according to claim 1, wherein the input control stage comprises:

a first transistor, the gate thereof for receiving the feedback signal;

a second transistor, the gate thereof for receiving the input clock;

a third transistor, the source thereof connected to the drain of the first transistor, and the gate thereof for receiving the input clock; and a fourth transistor, the drain thereof connected to the source of the second transistor, and with the gate thereof for receiving the feedback signal;

wherein, the drain of the second transistor is connected to the drain of the third transistor for outputting the modulating signal.

16. The PWCL for clock with any pulse-width ratio within a wide range according to claim 15, wherein the first and the third transistors are two PMOSs, while the second and the fourth transistors are two NMOSs.

17. The PWCL for clock with any pulse-width ratio within a wide range according to claim 1, wherein the input control stage comprises:
   a first transistor, the gate thereof for receiving the feedback signal; and
   a second transistor, the gate thereof for receiving the input clock, and the drain thereof connected with the drain of the first transistor for outputting the modulating signal.

18. The PWCL for clock with any pulse-width ratio within a wide range according to claim 17, wherein the first transistor is a PMOS, and the second transistor is an NMOS.

19. The PWCL for clock with any pulse-width ratio within a wide range according to claim 1, wherein the input control stage comprises:
   a first transistor, the gate thereof for receiving the input clock; and
   a second transistor, the gate thereof for receiving the feedback signal, and with the drain thereof connected to the drain of the first transistor for outputting the modulating signal.

20. The PWCL for clock with any pulse-width ratio within a wide range according to claim 19, wherein the first transistor is a PMOS, and the second transistor is an NMOS.

21. The PWCL for clock with any pulse-width ratio within a wide range according to claim 1, wherein the input control stage comprises:
   a first transistor, the gate thereof for receiving the feedback signal;
   a second transistor, the gate thereof for receiving the input clock, and the drain thereof connected to the drain of the first transistor;
   a third transistor, the gate thereof connected to the drains of the second and the first transistors; and
   a fourth transistor, the gate thereof for receiving the feedback signal, and the drain thereof connected to the drain of the third transistor for outputting the modulating signal.

22. The PWCL for clock with any pulse-width ratio within a wide range according to claim 21, wherein the first and the third transistors are two PMOSs, and the second and the fourth transistors are two NMOSs.

23. The PWCL for clock with any pulse-width ratio within a wide range according to claim 1, wherein the 2-stage LPF comprises:
   a cross capacitor;
   two resistors, wherein one of the resistors, the cross capacitor, and the other resistor are sequentially connected in series between the outputs of the first comparative signal and the second comparative signal of the programmable charge pump; and
   two bypass capacitors, respectively connected between the output of the first comparative signal of the programmable charge pump and a ground, and between the output of the second comparative signal of the programmable charge pump and the ground;
   wherein, the outputs of the first and the second comparative signals of the programmable charge pump are connected to the transconductor.

24. The PWCL for clock with any pulse-width ratio within a wide range according to claim 1, wherein each of the 2-stage LPFs comprises:
   a resistor, one end thereof connected between one of the outputs of the first and the second comparative signals of the programmable charge pump and the transconductor;
   a capacitor, connecting the other end of the resistor and a ground; and
   a bypass capacitor, connecting the transconductor and the ground.

25. The RWCL for clock with any pulse-width ratio within a wide range according to claim 1, wherein the buffer module is complementary.

26. The PWCL for clock with any pulse-width ratio within a wide range according to claim 25, wherein the complementary buffer module has a plurality of buffers, for buffering and reversing the modulating signal, so as to generate the output clock and the complementary signal.

27. The PWCL for clock with any pulse-width ratio within a wide range according to claim 26, wherein the complementary buffer module has a phase-blending module formed with the buffers, for generating the output clock and the complementary signal.

28. The PWCL for clock with any pulse-width ratio within a wide range according to claim 1, wherein the transconductor is an operational amplifier.

* * * * *